US012088002B2

(12) United States Patent
Jang et al.

(10) Patent No.: US 12,088,002 B2
(45) Date of Patent: Sep. 10, 2024

(54) ELECTRONIC DEVICE COMPRISING ANTENNA AND HOUSING INCLUDING NON-METALLIC MATERIAL

(71) Applicant: SAMSUNG ELECTRONICS CO., LTD., Suwon-si (KR)

(72) Inventors: Jigu Jang, Suwon-si (KR); Hoyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 17/976,597

(22) Filed: Oct. 28, 2022

(65) Prior Publication Data

US 2023/0055951 A1    Feb. 23, 2023

Related U.S. Application Data

(63) Continuation of application No. PCT/KR2021/003572, filed on Mar. 23, 2021.

(30) Foreign Application Priority Data

Apr. 28, 2020   (KR) .................. 10-2020-0051529

(51) Int. Cl.
  *H01Q 1/24*    (2006.01)
  *H01Q 1/38*    (2006.01)
  (Continued)

(52) U.S. Cl.
  CPC .............. *H01Q 1/243* (2013.01); *H01Q 1/38* (2013.01); *H04M 1/026* (2013.01); *H01Q 1/48* (2013.01)

(58) Field of Classification Search
  None
  See application file for complete search history.

(56) References Cited

U.S. PATENT DOCUMENTS 8,427,379 B2   4/2013   Rothkopf et al.
10,432,768 B2  10/2019  Choi et al.
        (Continued)

FOREIGN PATENT DOCUMENTS

CN    108650348    10/2018
CN    110324467    10/2019
        (Continued)

OTHER PUBLICATIONS

International Search Report dated Jun. 30, 2021, for PCT/KR2021/003572, 5 pp.

(Continued)

*Primary Examiner* — Wilson Lee
(74) *Attorney, Agent, or Firm* — Nixon & Vanderhye, P.C.

(57) ABSTRACT

An electronic device, according to an embodiment of the present disclosure, may comprise: a front plate; a rear plate positioned on an opposite side of the front plate; a side member including a side surface surrounding at least a part of a space between the front plate and the rear plate, and including a non-conductive material; a non-conductive member comprising a non-conductive material positioned in the space alongside the side member; an adhesive positioned between the side member and the non-conductive member; at least one antenna positioned in the space and spaced apart from the side member and having the non-conductive member therebetween, the at least one antenna is coupled to the non-conductive member; and a communication circuit configured to transmit and/or receive a signal in a selected or designated frequency band by means of the at least one antenna.

20 Claims, 20 Drawing Sheets

(51) Int. Cl.
*H04M 1/02* (2006.01)
*H01Q 1/48* (2006.01)

(56) References Cited

U.S. PATENT DOCUMENTS

| | | | |
|---|---|---|---|
| 2008/0001832 A1 | 1/2008 | Murakami et al. | |
| 2013/0127684 A1 | 5/2013 | Li et al. | |
| 2017/0135239 A1* | 5/2017 | Hyun | H04M 1/236 |
| 2018/0310426 A1* | 10/2018 | Cho | H04M 1/0266 |
| 2019/0364695 A1* | 11/2019 | Lee | H05K 7/20336 |
| 2020/0106167 A1 | 4/2020 | Moon et al. | |
| 2020/0381807 A1* | 12/2020 | Park | H01Q 21/0087 |
| 2021/0200020 A1* | 7/2021 | Kim | G02F 1/133512 |
| 2021/0204435 A1* | 7/2021 | Choi | G06F 1/1656 |
| 2021/0373679 A1* | 12/2021 | Shin | G06F 3/0393 |
| 2022/0158336 A1* | 5/2022 | Sone | H01Q 1/40 |
| 2023/0075243 A1* | 3/2023 | Song | G06F 1/1624 |

FOREIGN PATENT DOCUMENTS

| | | |
|---|---|---|
| CN | 110505325 | 11/2019 |
| KR | 10-0199337 | 3/1999 |
| KR | 10-0859080 | 9/2008 |
| KR | 10-0873772 | 12/2008 |
| KR | 10-2019-0020519 | 3/2019 |
| KR | 10-2019-0087140 | 7/2019 |
| KR | 10-2020-0038034 | 4/2020 |

OTHER PUBLICATIONS

Written Opinion of the ISA dated Jun. 30, 2021, for PCT/KR2021/003572, 8 pp.

Korean Office Action issued Mar. 18, 2024 in corresponding Korean Patent Application No. 10-2020-0051529.

* cited by examiner

ELECTRONIC DEVICE COMPRISING ANTENNA AND HOUSING INCLUDING NON-METALLIC MATERIAL

CROSS-REFERENCE TO RELATED APPLICATIONS

This application is a continuation of International Application No. PCT/KR2021/003572 designating the United States, filed on Mar. 23, 2021, in the Korean Intellectual Property Receiving Office and claiming priority to Korean Patent Application No. 10-2020-0051529, filed on Apr. 28, 2020, in the Korean Intellectual Property Office, the disclosures of which are incorporated by reference herein in their entireties.

BACKGROUND

Field

The disclosure relates to an electronic device having a housing including a non-metallic material and an antenna.

Description of Related Art

An electronic device may include a metallic exterior member, and such a metallic exterior member may not only provide a luxurious design unique to metal but also improve durability. The number of antennas included in an electronic device such as a smartphone is continuously increasing as the range of usable applications widens. While electronic devices are becoming slimmer, more components are being added for various functions, making it more difficult to secure an antenna mounting space. In this situation, the metallic exterior member has been used as an antenna.

In the case of electronic devices such as smartphones, design has emerged as a differentiating factor due to the upward leveling of the specification, and there is a trend of implementing the exterior member to have a visually luxurious texture. According to this trend, there is an attempt to apply a non-metallic exterior member to an electronic device in place of the metallic exterior member. However, since the non-metallic exterior member cannot be used as an antenna, a solution for implementing an antenna in a limited space of the electronic device is to be sought.

SUMMARY

Embodiments of the disclosure may provide an electronic device including a housing containing a non-metallic material and an antenna so that the antenna can be implemented by addressing the limited space of the electronic device while applying a non-metallic exterior member.

According to an example embodiment of the disclosure, an electronic device may include: a front plate; a rear plate positioned on an opposite side of the front plate; a side member comprising a side surface surrounding at least a portion of a space between the front plate and the rear plate and includes a non-conductive material; a non-conductive member comprising a non-conductive material positioned in the space along the side member; a bonding member comprising an adhesive positioned between the side member and the non-conductive member; at least one antenna positioned in the space and spaced apart from the side member with the non-conductive member interposed therebetween and coupled to the non-conductive member; and a communication circuit configured to transmit and/or receive a signal of a selected or designated frequency band through the at least one antenna.

The electronic device according to various example embodiments of the disclosure may provide a beautiful external appearance using a non-metal exterior member (e.g., ceramic) and may provide an antenna device within a limited space of the electronic device.

The electronic device according to an example embodiment may provide a rigid structure that may be less affected by an external impact while providing a housing including a non-metallic material.

In addition, effects obtainable or predicted by various embodiments of the disclosure will be disclosed explicitly or implicitly in the detailed description of various example embodiments of the disclosure. For example, various effects of various embodiments of the disclosure will be disclosed in the following detailed description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments of the present disclosure will be described with reference to the accompanying drawings.

Figure 1:
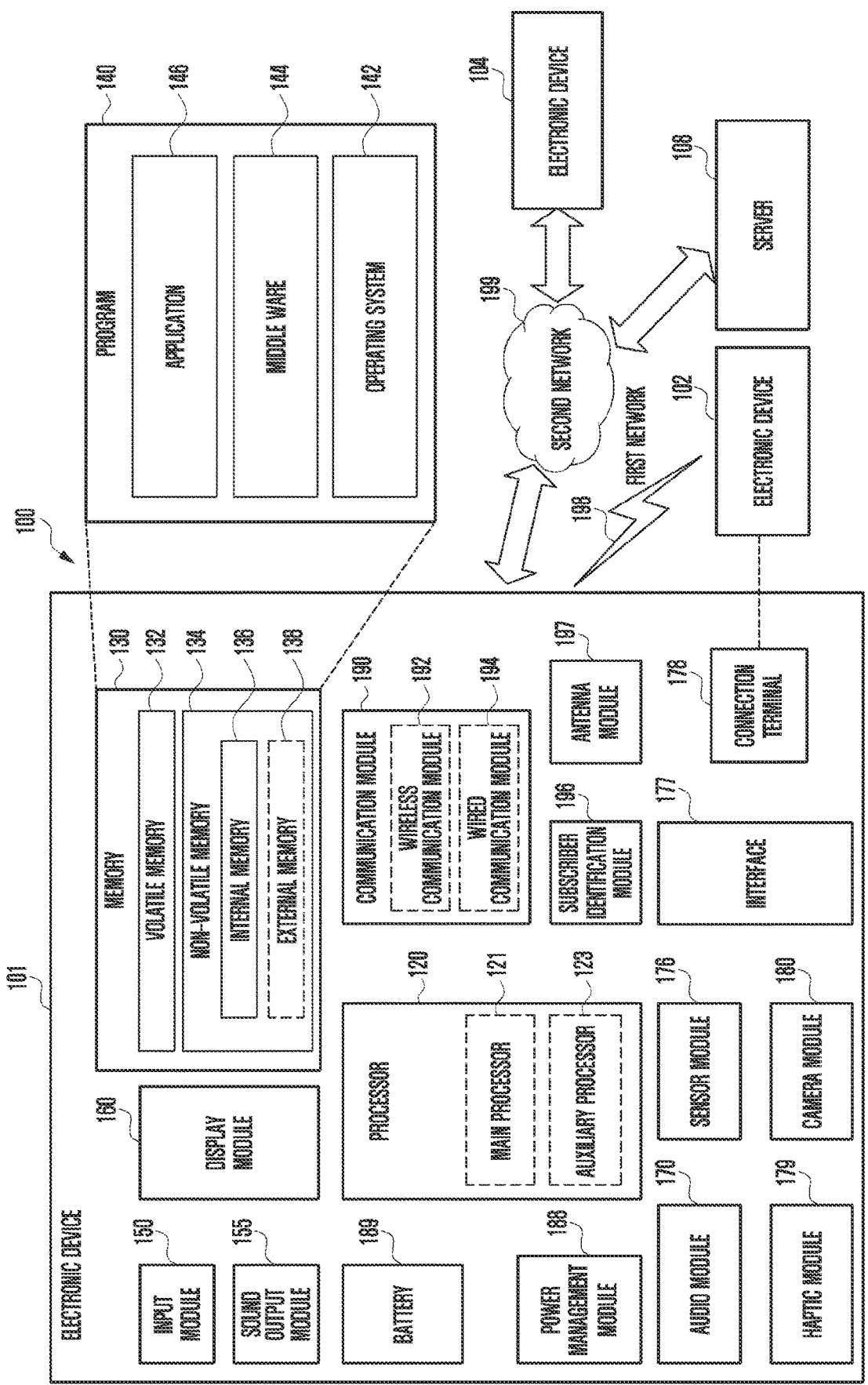
FIG. 1 is a block diagram illustrating an example electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In various embodiments, at least one (e.g., the display device 160 or the camera module 180) of the components may be omitted from the electronic device 101, or one or more other components may be added in the electronic device 101. In various embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store, for example, various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102)(e.g., a speaker or a headphone) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of a power management integrated circuit (PMIC).

The battery 189 may supply power to at least one component of the electronic device 101. According to an embodiment, the battery 189 may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to some embodiments, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry", etc. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
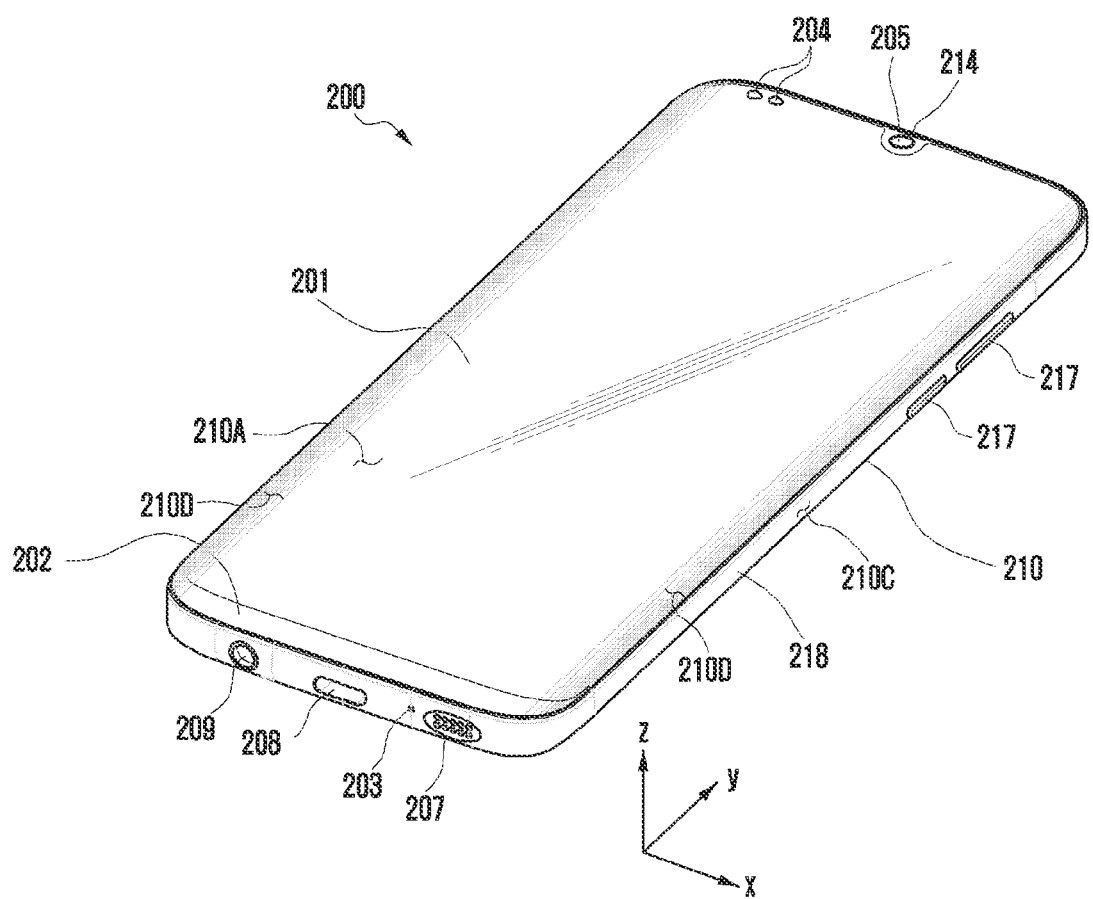
FIG. 2A is a front perspective view of a mobile electronic device according to various embodiments.
Figure 2B:
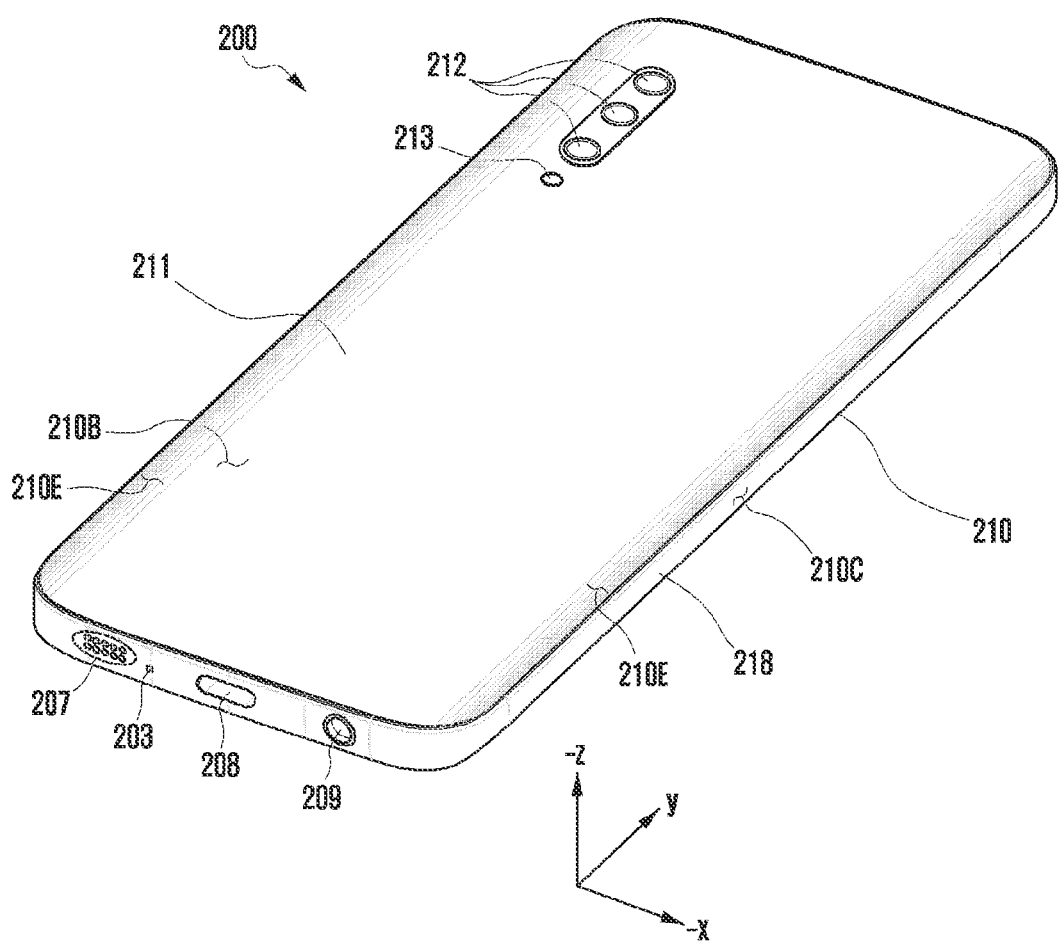
FIG. 2B is a rear perspective view of the electronic device of FIG. 2A according to various embodiments.

FIG. 2A is a front perspective view of a mobile electronic device 200 according to various embodiments. FIG. 2B is a rear perspective view of the electronic device 200 of FIG. 2A according to various embodiments.

According to various embodiments, the electronic device 200 of FIG. 2A may include the electronic device 101 of FIG. 1.

With reference to FIG. 2A and FIG. 2B, in an embodiment, the electronic device 200 may include a housing 210 that includes a first surface (or front surface) 210A, a second surface (or rear surface) 210B, and a side surface 210C surrounding a space between the first surface 210A and the second surface 210B. In an embodiment (not shown), the housing 210 may refer to a structure forming a part of the first surface 210A, the second surface 210B, and the side surface 210C. According to an embodiment, the first surface 210A may be formed by a front plate 202 (e.g., glass plate or polymer plate) whose at least a portion is substantially transparent. The second surface 210B may be formed by a rear plate 211 that is substantially opaque. The rear plate 211 may be formed by, for example, coated or tinted glass, ceramic, polymer, metal (e.g., aluminum, stainless steel (STS), or magnesium), or a combination of at least two thereof. The side surface 210C may be formed by a side member 218 that at least partially surrounds the space between the front plate 202 and the rear plate 211. The side member 218 may include a metal and/or a non-metal. According to an embodiment, the side member 218 may include a ceramic. In an embodiment, the rear plate 211 and side member 218 may be integrally formed and may include the same material.

According to various embodiments, the front plate 202 may include two first regions 210D that are curved and seamlessly extended from the front surface 210A toward the rear plate 211. The first regions 210D may be formed adjacent respectively to two long edges (not shown) of the front plate 202. According to various embodiments, the rear plate 211 may include two second regions 210E that are curved and seamlessly extended from the rear surface 210B toward the front plate 202. The second regions may be formed adjacent respectively to two long edges (not shown) of the rear plate 211.

According to an embodiment, the electronic device 200 may include at least one or more of display 201, audio modules 203, 207 and 214, sensor module 204, camera modules 205, 212 and 213, key input devices 217, or connector holes 208 and 209. In an embodiment, at least one of the elements (e.g., key input devices 217) may be omitted from the electronic device 200, or another element (e.g., fingerprint sensor or light emitting element) may be added to the electronic device 200.

The display 201 may be visually exposed (e.g., visible), for example, through a significant portion of the front plate 202. In an embodiment, the edge of the display 201 may be formed to have substantially the same shape as the adjacent periphery of the front plate 202. In an embodiment (not shown), to expand the visible area of the display 201, the distance between the periphery of the display 201 and the periphery of the front plate 202 may be formed substantially the same.

In an embodiment (not shown), a recess or opening may be formed in a portion of the screen display area of the display 201, and at least one of the audio module 214, the sensor module 204, or a first camera device 205 may be included in alignment with the recess or the opening. In an embodiment (not shown), at least one of the audio module 214, the sensor module 204, or the camera module 205 may be positioned adjacent to the back of the screen display area (e.g., active area) of the display 201. In an embodiment (not shown), the display 201 may be disposed to be coupled or adjacent to a touch sensing circuit, a pressure sensor capable of measuring the intensity (pressure) of a touch, and/or a digitizer for detecting a magnetic field type stylus pen.

The audio modules 203, 207 and 214 may include a microphone hole 203, and speaker holes 207 and 214. The microphone hole 203 may include a microphone disposed therein to obtain an external sound, and a plurality of microphones may be arranged to sense the direction of a sound in an embodiment. The speaker holes 207 and 214 may include an external speaker hole 207 and a call receiver hole 214. In an embodiment, the speaker holes 207 and 214 and the microphone hole 203 may be implemented as a single hole, or a speaker may be included without speaker holes 207 and 214 (e.g., piezo speaker).

The sensor module 204 may generate an electrical signal or a data value corresponding to an internal operating state of the electronic device 200 or an external environmental state. The sensor module 204 may include, for example, a proximity sensor that generates a signal regarding the proximity of an external object based on light passing through a region of the first surface 210A of the housing 210. According to various embodiments, the sensor module 204 may be various biometric sensors such as a fingerprint sensor for detecting biometric information based on light passing through a region of the first surface 210A. According to various embodiments, the fingerprint sensor may be disposed on the back of the display 201. According to various embodiments (not shown), the sensor module may include an HRM sensor and/or a fingerprint sensor positioned adjacent to the second surface 210B of the housing 210. The electronic device 200 may further include a sensor module which is not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor (e.g., sensor module 204).

The camera modules 205, 212 and 213 may include, for example, a first camera device 205, a second camera device 212, and/or a flash 213. The first camera device 205 may generate an image signal based on light passing through a region of the first surface 210A of the housing 210. The second camera device 212 and the flash 213 may be disposed on the second surface 210B of the housing 210. The camera devices 205 and 212 may include one or more lenses, an image sensor, and/or an image signal processor. The flash 213 may include, for example, a light emitting diode or a xenon lamp. In an embodiment, two or more lenses (infrared camera, wide-angle and telephoto lenses) and image sensors may be arranged in one surface of the electronic device 200.

The key input devices 217 may be arranged in the side surface 210C of the housing 210. In an embodiment, the electronic device 200 may not include some or all of the above-mentioned key input devices 217, and a key input device 217 not included may be implemented on the display 201 in a different form such as a soft key. In an embodiment, the key input device may include a sensor module (not shown) disposed on the second surface 210B of the housing 210.

A light emitting element (not shown) may be positioned adjacent to the first surface 210A inside the housing 210, for example. The light emitting element may provide state information of the electronic device 200 in a light form. In an embodiment, the light emitting element may provide a light source interacting with, for example, the operation of the first camera device 205. The light emitting element may include, for example, an LED, an IR LED, or a xenon lamp.

The connector holes 208 and 209 may include a first connector hole 208 capable of accepting a connector (e.g., USB connector) for transmitting and receiving power and/or data to and from an external electronic device, and/or a second connector hole 209 (e.g., earphone jack) capable of accepting a connector for transmitting and receiving an audio signal to and from an external electronic device.

Figure 3:
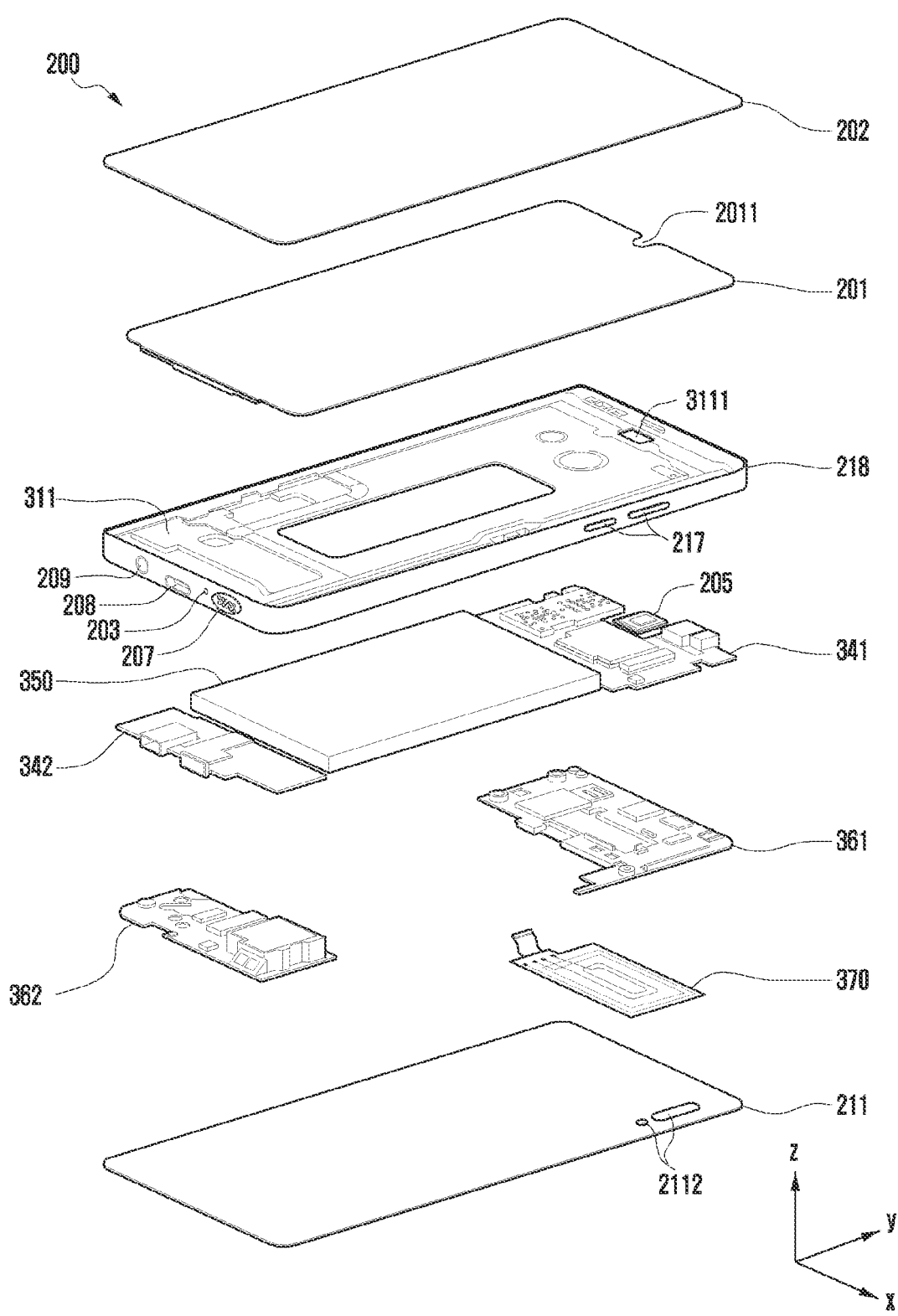
FIG. 3 is an exploded perspective view of the electronic device of FIG. 2A according to various embodiments

FIG. 3 is an exploded perspective view of the electronic device 200 of FIG. 2A according to various embodiments.

With reference to FIG. 3, in an embodiment, the electronic device 200 may include a side member 218, a first support member 311 (e.g., bracket), a front plate 202, a display 201, a first substrate assembly 341, a second substrate assembly 342, a battery 350, a second support member 361, a third support member 362, an antenna structure 370, or a rear plate 211. In an embodiment, at least one of the components (e.g., second support member 361, or third support member 362) may be omitted from the electronic device 200, or another component may be additionally included in the electronic device 200.

The first support member 311 may be arranged, for example, inside the electronic device 200, and may be connected to the side member 218 or may be integrally formed with the side member 218. The first support member 311 may be made of, for example, a metal material and/or a non-metal material (e.g., polymer).

The display 201 may be coupled to, for example, one surface of the first support member 311 and may be positioned between the first support member 311 and the front plate 202. The first substrate assembly 341 and the second substrate assembly 342 may be coupled to, for example, the other surface of the first support member 311 and may be positioned between the first support member 311 and the rear plate 211.

According to an embodiment, the first substrate assembly 341 may include a first printed circuit board (PCB) (not shown). The display 201 or the first camera device 205 may be electrically connected to the first printed circuit board through various electrical paths such as a flexible printed circuit board (FPCB). The first substrate assembly 341 may include various electronic components electrically connected to the first printed circuit board. These electronic components may be disposed on the first printed circuit board or may be electrically connected to the first printed circuit board through electrical paths such as a cable or FPCB. The electronic components may include, for example, at least some of the components included in the electronic device 101 of FIG. 1.

According to various embodiments, the first substrate assembly 341 may include a first PCB, a third PCB disposed to partially overlap the first PCB, and/or an interposer substrate between the first PCB and the third PCB.

According to an embodiment, the second substrate assembly 342 may be disposed to be spaced apart from the first substrate assembly 341 with the battery 350 interposed therebetween when viewed from above the front plate 202. The second substrate assembly 342 may include a second printed circuit board electrically connected to the first printed circuit board of the first substrate assembly 341. The second substrate assembly 342 may include various electronic components electrically connected to the second printed circuit board. These electronic components may be disposed on the second printed circuit board or may be electrically connected to the second printed circuit board through electrical paths such as a cable or FPCB. The electronic components may include, for example, at least some of the components included in the electronic device 101 of FIG. 1. According to an embodiment, the electronic component may be a USB connector utilizing the first connector hole 208, an earphone jack utilizing the second connector hole 209, a microphone utilizing the microphone hole 203, or a speaker utilizing the speaker hole 207.

According to an embodiment, the battery 350 may be positioned between the first support member 311 and the rear plate 211, and may be coupled to the first support member 311. The battery 350 is a device for supplying power to at least one component of the electronic device 200, and may include, for example, a non-rechargeable primary cell, a rechargeable secondary cell, or a fuel cell. At least some of the battery 350 may be disposed substantially coplanar with, for example, the first printed circuit board of the first substrate assembly 341 or the second printed circuit board of the second substrate assembly 342. The battery 350 may be integrally disposed inside the electronic device 200, or may be disposed attachably and detachably with the electronic device 200.

According to an embodiment, the second support member 361 may be positioned between the first support member 311 and the rear plate 211, and may be coupled to the first support member 311 through a fastening element such as a bolt. At least some of the first substrate assembly 341 may be disposed between the first support member 311 and the second support member 361, and the second support member 361 may cover and protect the first substrate assembly 341.

According to an embodiment, when viewed from above the front plate 202, the third support member 362 may be positioned to be spaced apart from the second support member 361 with the battery 350 interposed therebetween. The third support member 362 may be disposed between the first support member 311 and the rear plate 211, and may be coupled to the first support member 311 through a fastening element such as a bolt. At least some of the second substrate assembly 342 may be positioned between the first support member 311 and the third support member 362, and the third support member 362 may cover and protect the second substrate assembly 342.

According to an embodiment, the second support member 361 and/or the third support member 362 may be made of a metal material and/or a non-metal material (e.g., polymer). According to various embodiments, the second support member 361 and/or the third support member 362 may be referred to as a rear case.

According to an embodiment (not shown), an integral substrate assembly including the first substrate assembly 341 and second substrate assembly 342 may be implemented. In this case, the substrate assembly may further include a portion extended between the battery 350 and the side member 218. In this case, according to various embodiments, an integral support member including the second support member 361 and third support member 362 may be implemented.

According to an embodiment, the antenna structure 370 may be disposed between the second support member 361 and the rear plate 211. The antenna structure 370 may be implemented, for example, in the form of a film such as an FPCB. According to an embodiment, the antenna structure 370 may include at least one conductive pattern used as a loop-type radiator. For example, the at least one conductive pattern may include a planar spiral conductive pattern (e.g., planar coil or pattern coil).

According to an embodiment, the conductive pattern of the antenna structure 370 may be electrically connected to a wireless communication circuit (e.g., wireless communication module 192 in FIG. 1) disposed on the first substrate assembly 341. For example, the conductive pattern may be utilized for short-range wireless communication such as near field communication (NFC). As another example, the conductive pattern may be utilized for magnetic secure transmission (MST) for transmitting and/or receiving a magnetic signal.

According to various embodiments, the conductive pattern of the antenna structure 370 may be electrically connected to a power transceiver circuit disposed on the first substrate assembly 341. Through the conductive pattern, the power transceiver circuit may wirelessly receive power from an external electronic device or may wirelessly transmit power to an external electronic device. The power transceiver circuit may include a power management integrated circuit (PMIC) or a charger integrated circuit (IC) included in the power management module 188 in FIG. 1, and may charge the battery 350 using power received through the conductive pattern.

According to an embodiment, the display 201 may include an opening 2011 formed at at least a portion corresponding to an optical sensor (e.g., first camera device 205 or biometric sensor) disposed inside the electronic device 200. The opening 2011 may be formed, for example, in the shape of a notch. According to an embodiment, the opening 2011 may be implemented in the form of a through hole. The first support member 311 may include an opening 3111 positioned in correspondence to the opening 2011 of the display 201. The optical sensor may receive external light through the opening 2011 of the display 201, the opening 3111 of the first support member 311, and a region of the front plate 202 aligned therewith. According to various embodiments (not shown), the opening 2011 of the display 201 may be replaced with a substantially transparent region formed by modifying the pixel structure and/or wiring structure.

According to an embodiment, the rear plate 211 may include an opening 2112 for disposing the second camera device 212 and the flash 213 included in the first substrate assembly 341 to be exposed to the rear surface 210B.

Figure 4:
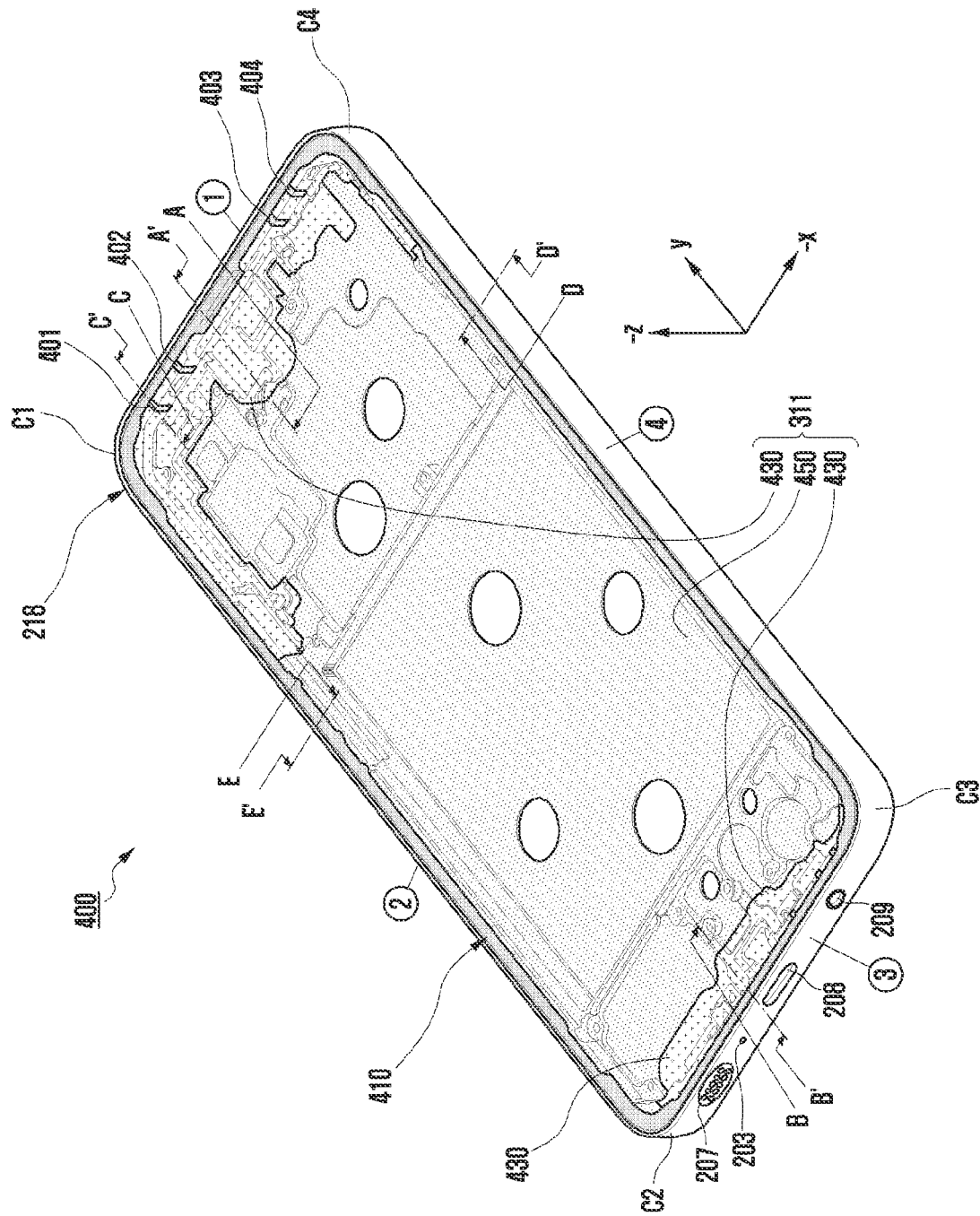
FIG. 4 is a perspective view illustrating an example frame structure according to various embodiments.

FIG. 4 is a perspective view illustrating a frame structure 400 according to various embodiments.

With reference to FIG. 4, in an embodiment, the frame structure 400 may include a side member 218, a first support member 311, or a first non-conductive member 410. A description of some reference symbols in FIG. 4 may not be repeated.

According to an embodiment, the side member 218 may include at least one corner connecting two side parts that are not parallel to each other. For example, the side member 218 may include a first side part ①  facing in the positive y-axis direction, a second side part ② facing in the positive x-axis direction, a third side part ③ facing in the negative y-axis direction, or a fourth side part ④ facing in the negative x-axis direction. The first side part ① and the third side part ③ may be parallel to each other and have a first length. The second side part ② and the fourth side part ④ may be parallel to each other and have a second length longer than the first length. The side member 218 may include a first corner C1 that seamlessly connects the first side part ① and the second side part ②, a second corner C2 that seamlessly connects the second side part ② and the third side part ③, a third corner C3 that seamlessly connects the third side part ③ and the fourth side part ④, or a fourth corner (C4) that seamlessly connects the first side part ① and the fourth side part ④. For example, the first corner C1, the second corner C2, the third corner C3, or the fourth corner C4 may be formed as a curved or rounded corner.

According to an embodiment, the side member 218 may include a ceramic. For example, the side member 218 may include a zirconia ceramic. According to various embodiments, the side member 218 may be implemented with a ceramic structure including aluminum oxide ($Al_2O_3$), silicon carbide (SiC), or silicon nitride ($Si_3N_4$). According to various embodiments, the side member 218 may be made of various other ceramics or a combination of at least two ceramics. The side member 218 may be integrally implemented without a segmented portion. The side member 218 may have a ceramic texture. According to various embodiments, the side member 218 may be implemented with various other non-metallic materials (e.g., polymers).

According to an embodiment, the side member 218 may be implemented without a segmented portion, and thus, the external appearance (e.g., side surface 210C in FIG. 2A) made of the side member 218 may have a unified beauty without a segmented line. According to an embodiment, the side member 218 including a ceramic may have a luster, so that the aesthetics of the electronic device 200 of FIG. 2A may be improved.

According to various embodiments, the side member 218 made of a non-metal material such as a ceramic may prevent and/or reduce an electric shock. For example, due to a defect or breakage of an external power supply, a high voltage alternating current may be unintentionally supplied from the external power supply to the electronic device 200. The high voltage alternating current may leak to the first support member 311, but the side member 218 may prevent and/or reduce the leakage current from flowing into the human body.

According to an embodiment, the first non-conductive member 410 may be positioned in the space between the front plate 202 of FIG. 2A and the rear plate 211 of FIG. 2B along the side member 218.

Figure 5:
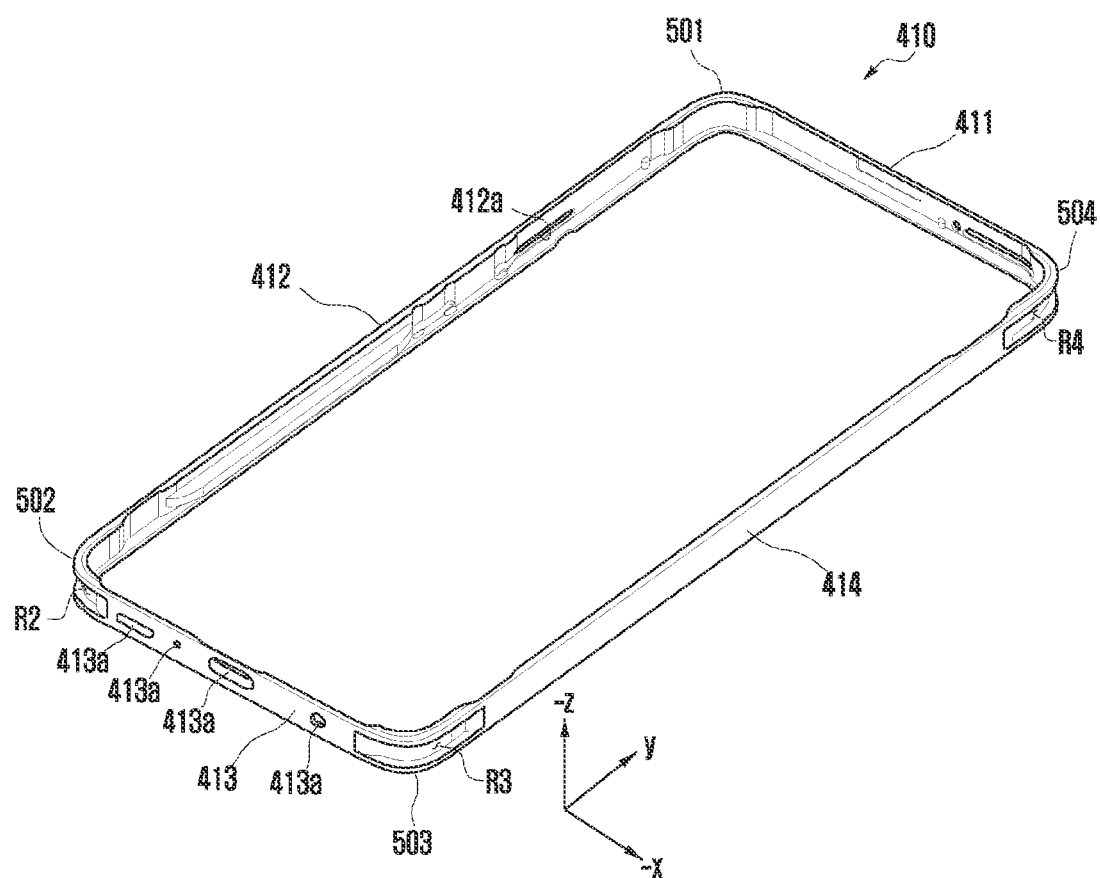
FIG. 5 is a perspective view illustrating an example non-conductive member of FIG. 4 according to various embodiments.

FIG. 5 is a perspective view illustrating the non-conductive member 410 of FIG. 4 according to various embodiments.

With reference to FIGS. 4 and 5, in an embodiment, the first non-conductive member 410 may be formed in the shape of a rectangular ring (e.g., closed loop) extended along the side member 218. For example, the first non-conductive member 410 may include a first part 411 corresponding to the first side part ①, a second part 412 corresponding to the second side part ②, a third part 413 corresponding to the third side part ③, or a fourth part 414 corresponding to the fourth side part ④. The first non-conductive member 410 may include a first corner portion 501 that connects the first part 411 and the second part 412 and corresponds to the first corner C1. The first non-conductive member 410 may include a second corner portion 502 that connects the second part 412 and the third part 413 and corresponds to the second corner C2. The first non-conductive member 410 may include a third corner portion 503 that connects the third part 413 and the fourth part 414 and corresponds to the third corner C3. The first non-conductive member 410 may include a fourth corner portion 504 that connects the first part 411 and the fourth part 414 and corresponds to the fourth corner C4. The first non-conductive member 410 may include various polymers.

According to an embodiment, the first part 411, the second part 412, the third part 413, or the fourth part 414 may include at least one opening. For example, the second part 412 may include at least one opening 412a corresponding to the key input devices 217 in FIG. 2A. For example, the third part 413 may include a plurality of openings 413a corresponding to the microphone hole 203, the speaker hole 207, the first connector hole 208, or the second connector hole 209.

According to an embodiment, the first support member 311 may be positioned in the space between the front plate 202 in FIG. 2A and the rear plate 211 in FIG. 2B so as to be laterally surrounded by the first non-conductive member 410.

Figure 6:
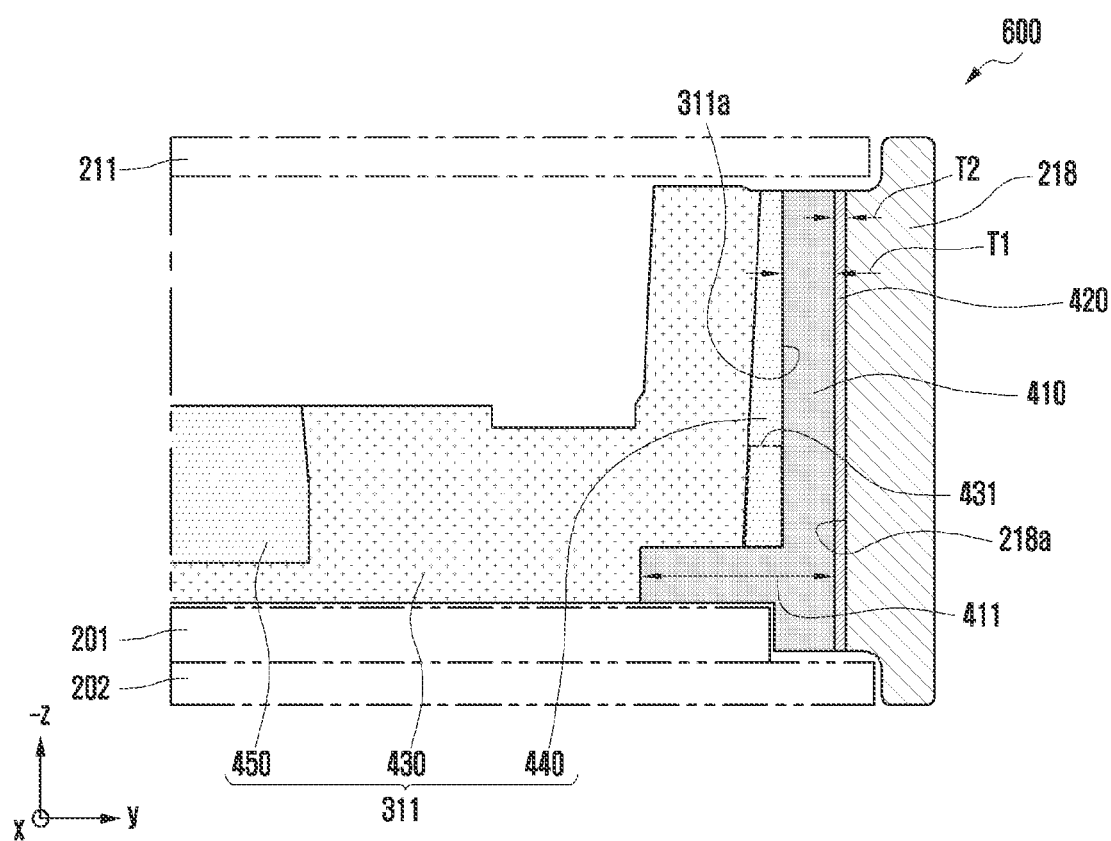
FIG. 6 is a cross-sectional view taken along line A-A' or line B-B' in the frame structure of FIG. 4 according to various embodiments.

FIG. 6 is a cross-sectional view 600 taken along line A-A' or line B-B' in the frame structure 400 of FIG. 4 according to various embodiments.

With reference to FIG. 6, in an embodiment, the cross-sectional structure 600 may include a side member 218, a first support member 311, a first non-conductive member 410, or a bonding member 420. A description of some reference symbols in FIG. 6 may not be repeated.

With reference to FIGS. 4 and 6, in an embodiment, the bonding member 420 may be positioned between the side member 218 and the first non-conductive member 410. The bonding member 420 may include adhesive materials of various polymers.

According to an embodiment, the first support member 311 may include a second non-conductive member 430 and at least one first conductive member 440 connected to the second non-conductive member 430. The at least one first conductive member 440 may be at least partially positioned between the second non-conductive member 430 and the first non-conductive member 410.

According to an embodiment, the first support member 311 may include a second conductive member 450 connected to the second non-conductive member 430. The second conductive member 450 may be physically separated from the at least one first conductive member 440. According to an embodiment, the first conductive member 440 and the second conductive member 450 may be connected and integrally formed, and may include the same metal material.

Figure 7:
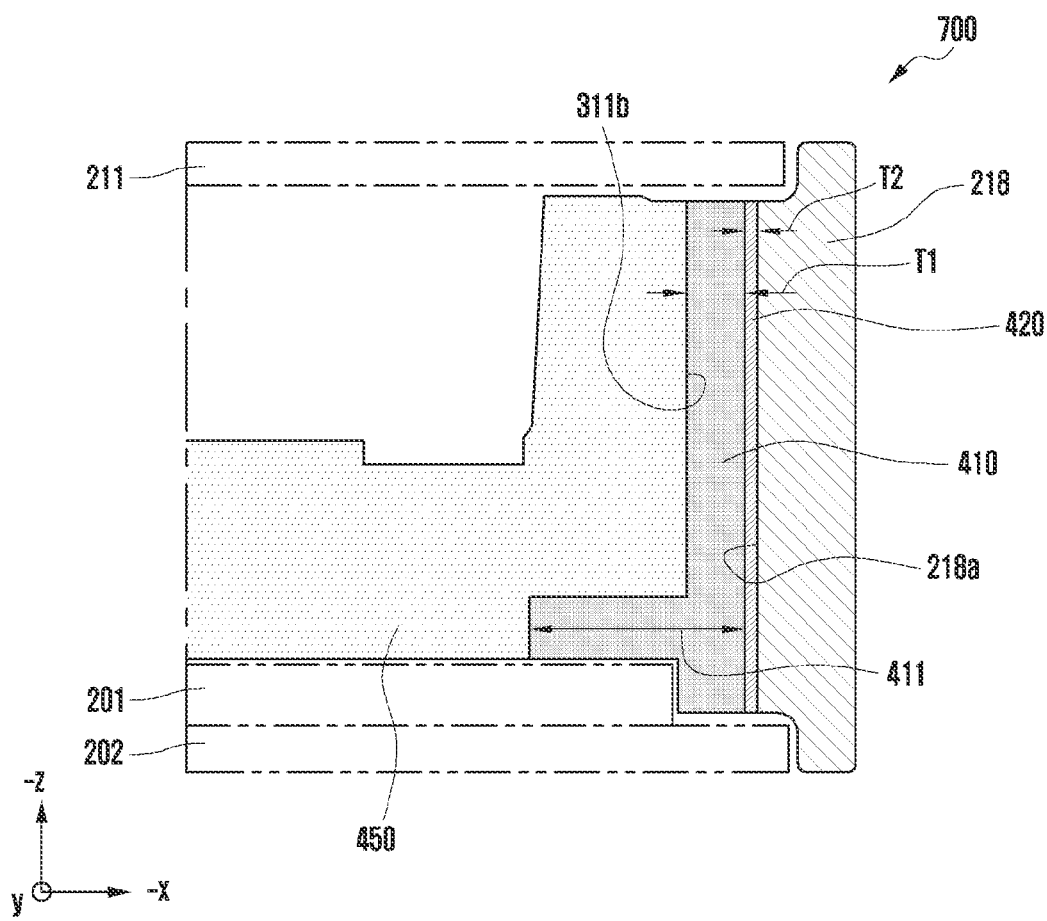
FIG. 7 is a cross-sectional view taken along line D-D' or line E-E' in the frame structure of FIG. 4 according to various embodiments.

FIG. 7 is a cross-sectional view 700 taken along line D-D' or line E-E' in the frame structure 400 of FIG. 4 according to various embodiments.

With reference to FIGS. 4 and 7, in an embodiment, the second conductive member 450 may be extended to the second non-conductive member 430 to be connected to the first non-conductive member 410. According to an embodiment, the second non-conductive member 430 may be formed in a form coupled to the at least one first conductive member 440 and the second conductive member 450 through injection molding (e.g., insert injection molding).

For example, the first support member 311 may be fabricated through a first operation of forming a metal member for the at least one first conductive member 440 and the second conductive member 450, a second operation of forming a non-metal member (e.g., second non-conductive member 430 in FIG. 4 or 6) coupled to the metal member via injection molding, and a third operation of processing the outer shape. The metallic member may include, for example, a metallic material such as titanium, amorphous alloy, or stainless steel. A technique such as computer numerical control (CNC), die casting, or pressing may be utilized for the first operation. A structure including a metal member and a non-metal member may be formed through the first operation and the second operation, the outer shape of the structure may be processed through the third operation to substantially form the first support member 311. Outer shape processing such as cutting or etching may be utilized for the third operation. The metal member may include at least one bridge connecting the at least one first conductive member 440 and the second conductive member 450, and the bridge may be removed in the third operation. Thereby, the at least one first conductive member 440 and the second conductive member 450 may be physically separated from the second non-conductive member 430. According to an embodiment, the first conductive member 440 of the first support member 311 may be used as an antenna or antenna radiator of the electronic device 200 of FIG. 2A. According to various embodiments, the third operation may be performed as a part of the first operation.

According to various embodiments, the first conductive member 440 may be implemented by laser direct structuring (LDS). The first conductive member 440 may be formed by drawing a pattern on the second non-conductive member 430 using a laser and plating a conductive material such as copper or nickel thereon. According to various embodiments, the first conductive member 440 may be disposed on the second non-conductive member 430 in various other ways such as printing or FPCB.

According to an embodiment, the first non-conductive member 410 may be positioned between the side member 218 and the first support member 311 to reduce damage to the side member 218 due to an external impact (e.g., impact caused by a drop). The first non-conductive member 410 may absorb or mitigate an external impact. The first non-conductive member 410 may buffer an effect of the stress exerted by the first support member 311 on the side member 218 with respect to an external impact. For example, the thickness T1 (see FIG. 6 or 7) of the first non-conductive member 410 between the side member 218 and the first support member 311 may be formed to be about 20 μm (micrometer) to about 100 μm.

According to various embodiments, the first non-conductive member 410 may include an extension portion 411 (see FIGS. 6 and 7) protruding toward the first support member 311. Although not shown, the extension portion 411 may be extended to the first corner C1, the second corner C2, the third corner C3, or the fourth corner C4 in FIG. 4, so that torsional rigidity or durability of the first non-conductive member 410 may be improved. The extension portion 411 may provide a resistive force that prevents/reduces the first non-conductive member 410 and the first support member 311 or the side member 218 and the first non-conductive member 410 from being separated by an external impact.

According to an embodiment, the first non-conductive member 410 may be formed by filling a polymer between the side member 218 and the first support member 311. For example, the first non-conductive member 410 may be molded by disposing the side member 218 and the first support member 311 in a mold, injecting a resin, and then solidifying the resin. This molding scheme may allow the first non-conductive member 410 to be firmly filled between the side member 218 and the first support member 311 without a gap. This molding scheme can overcome the difficult assembly condition in which the first non-conductive member 410 is separately formed and then disposed between the side member 218 and the first support member 311.

As another example, the first non-conductive member 410 may be included in the first support member 311. For instance, the first support member 311 may be fabricated through a first operation of forming a metal member for the least one first conductive member 440 and the second conductive member 450, a second operation of forming a non-metal member (e.g., first non-conductive member 410 and second non-conductive member 430) coupled to the metal member via injection molding, and a third operation of processing the outer shape. According to various embodiments, the third operation may be performed as a part of the first operation.

As another example, the first non-conductive member 410 may be provided in a form attached to the first support member 311 or the side member 218.

According to an embodiment, the first support member 311 may be defined to include the first non-conductive member 410.

According to an embodiment, the first conductive member 440 of the first support member 311 may include a first bonding surface 311a (refer to FIG. 6) facing the first non-conductive member 410. The second conductive member 450 of the first support member 311 may include a second bonding surface 311b (refer to FIG. 7) facing the first non-conductive member 410. The first bonding surface 311a or the second bonding surface 311b may be formed in a concave-convex shape (e.g., uneven surface), which may increase the bonding area to improve the bonding force between the first support member 311 and the first non-conductive member 410. According to various embodiments, the concave-convex shape may be implemented as a fitting structure such as a dovetail joint, so that the bonding force between the first support member 311 and the first non-conductive member 410 may be improved. According to various embodiments, the concave-convex shape may be formed using various techniques such as laser, scratcher, blasting, CNC machining, or etching (e.g., chemical etching).

According to various embodiments (not shown), the second non-conductive member 430 of the first support member 311 may include a portion connected to the first non-conductive member 410. This portion may correspond to, for example, a portion filled in the space in which the at least one first conductive member 440 or second conductive member 450 is not disposed between the first support member 311 and the first non-conductive member 410. One surface of the second non-conductive member 430 bonded to the first non-conductive member 410 may include a concave-convex shape to thereby improve the bonding force between the first support member 311 and the first non-conductive member 410.

According to an embodiment, the bonding member 420 may increase the bonding force or bonding strength between the first non-conductive member 410 and the side member 218. For example, the first non-conductive member 410 may be formed between the side member 218 and the first support member 311 through injection molding without the bonding member 420. In this case, due to various molding conditions related to injection molding (e.g., pressure, speed, position, time, or temperature), the bonding force between the first non-conductive member 410 and the side member 218 may be weak, or a bonding defect may occur therebetween. For example, shrinkage may occur due to the influence of molding conditions, and due to the shrinkage, there may be a bonding defect (e.g., crack) such as a gap occurring in the bonding portion between the first non-conductive member 410 and the side member 218. Such shrinkage may occur under molding conditions where the temperature of the mold is inadvertently lowered. When the temperature of the mold is inadvertently lowered, defects such as weld lines, carbonization, or black spots that reduce the strength of the first non-conductive member 410 may also occur. As another example, when the temperature of the molten resin is lower or higher than the set temperature, there may be a defect regarding the filling of the molten resin in the mold, and due to this, a bonding defect may occur between the first non-conductive member 410 and the side member 218. A bonding defect may occur between the first non-conductive member 410 and the side member 218 due to various other molding conditions. In some cases, a defect may be not found in an external inspection (e.g., visual inspection), but there may be a bonding defect in the bonding portion between the first non-conductive member 410 and the side member 218. The bonding member 420 may reduce bonding defects between the first non-conductive member 410 and the side member 218 and increase the bonding force or bonding strength at the interface thereof.

According to an embodiment, the bonding member 420 may include a material capable of increasing the interfacial bonding strength between the first non-conductive member 410 and the side member 218. For example, the bonding member 420 may be strongly bonded to both the first non-conductive member 410 and the side member 218. The interfacial bonding strength may include the mechanical strength indicating resistance to fracture by an external force, or the environmental strength indicating resistance to destruction by the environment (water, heat, etc.).

According to an embodiment, the first non-conductive member 410 may be formed between the side member 218 and the first support member 311 by applying the adhesive material of the bonding member 420 to the side member 218 and then performing injection molding. Considering the curing time of the adhesive material of the bonding member 420, it may be advantageous in process to apply the material of the bonding member 420 to the side member 218 before injection molding (e.g., insert injection molding). According to an embodiment, the first non-conductive member 410 may be formed between the side member 218 and the first support member 311 by applying the adhesive material of the bonding member 420 to the first support member 311 and then performing injection molding. According to an embodiment, the first non-conductive member 410 may be formed between the side member 218 and the first support member 311 by applying the adhesive material of the bonding member 420 to both the side member 218 and the first support member 311 and then performing injection molding.

The adhesive material of the bonding member 420 may be, for example, a material that responds to heat or pressure generated while the first non-conductive member 410 is being formed through injection molding. The adhesive material of the bonding member 420 may be tightly coupled to the side member 218 and the first support member 311 in response to heat or pressure generated while the first non-conductive member 410 is being formed through injection molding. For example, while the first non-conductive member 410 is being formed, the adhesive material of the bonding member 420 may be fused to the first non-conductive member 410. The bonding member 420 may not substantially generate a gap in the bonding portion between the side member 218 and the first support member 311. The bonding member 420 may prevent and/or reduce the bonding portion between the side member 218 and the first non-conductive member 410 from being damaged in response to an external impact caused by such a situation where the electronic device 200 of FIG. 2A is dropped. The bonding member 420 may prevent and/or reduce the side member 218 from being damaged and scattered due to an external impact.

According to an embodiment, the bonding member 420 may be made of a thermosetting material. For example, the first non-conductive member 410 may be formed between the side member 218 and the first support member 311 through applying a thermosetting material to at least one of the side member 218 or the first support member 311, semi-curing it, and then injection molding.

According to various embodiments, the bonding member 420 may include various organic bonding materials. For example, the bonding member 420 may include various polymers such as triazine thiol, dithio pyrimidine, or silane-based compounds.

According to an embodiment, the thickness T2 (refer to FIG. 6 or FIG. 7) of the bonding member 420 between the side member 218 and the first non-conductive member 410 may be about 50 μm or less. The thickness T2 may be formed in various ways so as to have a resistive force that prevents/reduces the side member 218 and the first non-conductive member 410 from being separated in response to an external impact. The thickness T2 may be formed in various ways in consideration of the side member 218, the first support member 311, the first non-conductive member 410, and a spatial arrangement relationship therebetween. According to an embodiment, the thickness T2 may be formed such that the bonding force between the side member 218 and the first non-conductive member 410 has a tensile strength of about 40 mPa.

According to various embodiments, one surface 218a (refer to FIG. 6 or FIG. 7) of the side member 218 facing the bonding member 420 may be formed in a concave-convex shape (e.g., uneven surface). This concave-convex shape may increase the bonding area to improve the bonding force between the side member 218 and the bonding member 420. The concave-convex shape may be formed using various techniques such as laser, scratcher, blasting, CNC machining, or etching (e.g., chemical etching). According to an embodiment, the one surface 218a of the side member 218 facing the bonding member 420 may include a concave-convex surface having a centerline average roughness (Ra) of about 0.5 μm to about 10 μm.

In an embodiment, the bonding member 420 may be omitted. In this case, to improve the bonding force between the first non-conductive member 410 and the side member 218, a coupling structure such as a dovetail joint may be formed at their interface.

With reference to FIGS. 6 and 7, in an embodiment, the display 201 and the front plate 202 may be positioned on one side of the frame structure 400. The rear plate 211 may be positioned on the other side of the frame structure 400.

According to various embodiments, the first conductive member 440 may be not extended to a space closer to the front plate 202 than the rear plate 211 (refer to indicia 431 in FIG. 6). The second non-conductive member 430 or the first non-conductive member 410 may be filled in this space 431. Thereby, a separation distance may be secured between the first conductive member 440 used as an antenna radiator and the display 201. This separation distance may reduce the electromagnetic influence of the display 201 on the first conductive member 440 to thereby secure antenna radiation performance.

According to an embodiment, the at least one first conductive member 440 may be electrically connected to a wireless communication circuit (e.g., wireless communication module 192 in FIG. 1). The at least one first conductive member 440 may be electrically connected to a ground (e.g., ground plane) included in the printed circuit board (e.g., first printed circuit board included in the first substrate assembly 341 in FIG. 3). The wireless communication circuit may be configured to transmit and/or receive a signal of a selected or designated frequency band through the first conductive member 440. The wireless communication circuit may provide a radiation current (or, radio signal) to the at least one first conductive member 440 (e.g., first antenna radiator 810 and/or second antenna radiator 820 in FIG. 8); a path through which the radiation current flows and/or the distribution of the radiation current in the at least one first conductive member 440 may form an electromagnetic field capable of transmitting and/or receiving a signal of a corresponding frequency band.

Figure 8:
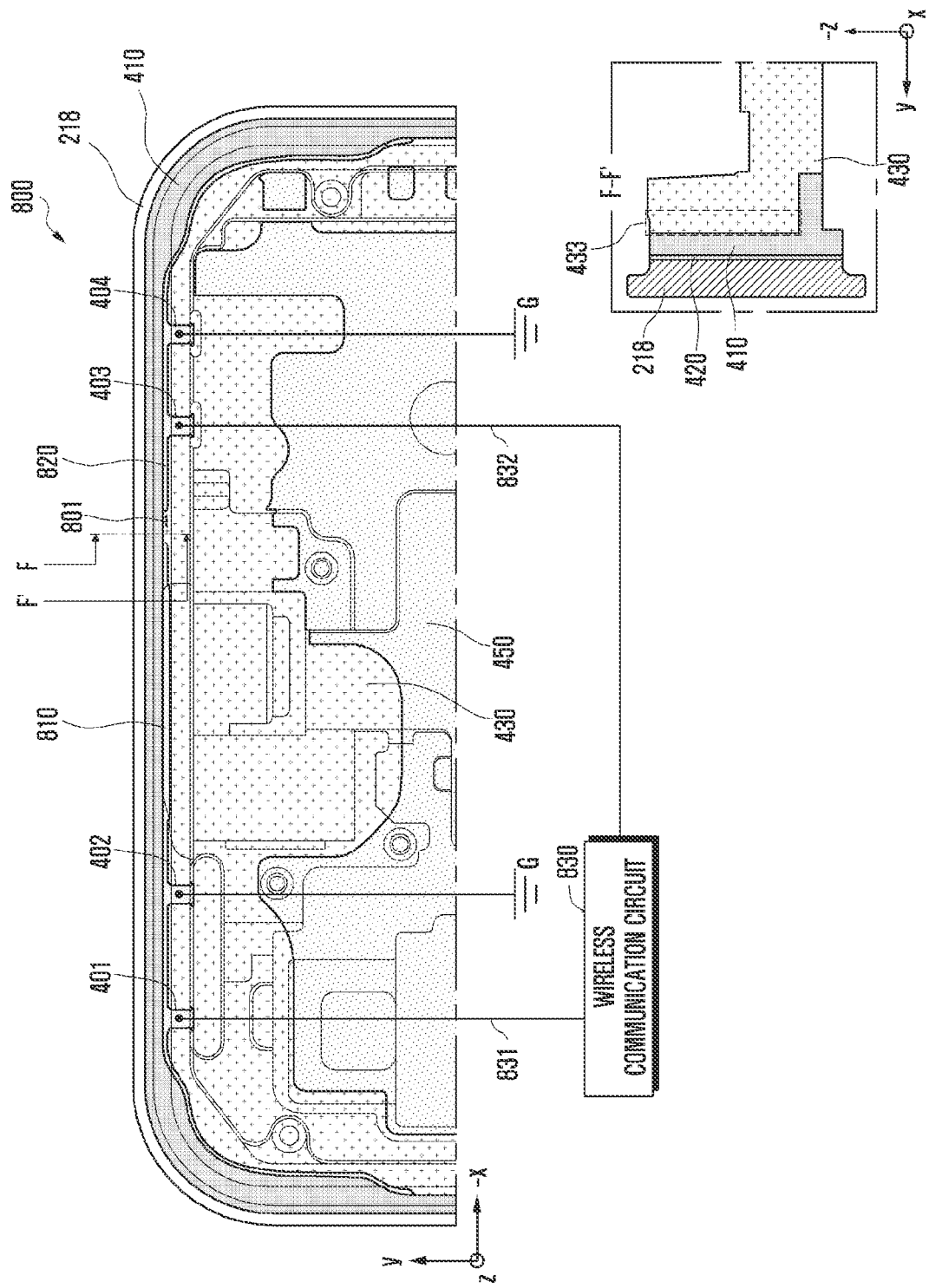
FIG. 8 is a diagram illustrating an example antenna device according to various embodiments.

FIG. 8 is a diagram illustrating an example antenna device 800 according to various embodiments.

With reference to FIG. 8, in an embodiment, the antenna device 800 may include a first antenna radiator 810, a second antenna radiator 820, a wireless communication circuit 830, or a ground G. The first antenna radiator 810 and the second antenna radiator 820 may be electrically connected to the wireless communication circuit (or, communication circuit) 830 and the ground G. A description of some reference symbols in FIG. 8 may not be repeated.

According to an embodiment, the first antenna radiator 810 or the second antenna radiator 820 may be implemented using the at least one first conductive member 440 included in the frame structure 400 of FIG. 6. The first antenna radiator 810 and the second antenna radiator 820 may be disposed to be physically separated from each other. According to an embodiment, a gap or cut-off portion 801 may be positioned between the first antenna radiator 810 and the second antenna radiator 820, so that the first antenna radiator 810 and the second antenna radiator 820 may be physically separated. Referring to the cross-sectional view along line F-F' in FIG. 8, a portion 433 of the second non-conductive member 430 may be filled in the cut-off portion 820. The wireless communication circuit 830 and the ground G may be disposed on, for example, the first printed circuit board included in the first substrate assembly 341 in FIG. 3. The ground G (e.g., ground plane) included in the first printed circuit board may operate as an antenna ground for the antenna device 800.

With reference to FIGS. 4 and 8, in an embodiment, the first conductive member 440 may include the first antenna radiator 810 or the second antenna radiator 820. In an embodiment, the first antenna radiator 810 may include a first terminal 401 or a second terminal 402. At least one of the first terminal 401 or the second terminal 402 may be electrically connected to the wireless communication circuit 830, and the terminal not electrically connected to the wireless communication circuit 830 may be electrically connected to the ground G. The second antenna radiator 820 may include a third terminal 403 and a fourth terminal 404. At least one of the third terminal 403 or the fourth terminal 404 may be electrically connected to the wireless communication circuit 830, and the terminal not electrically connected to the wireless communication circuit 830 may be electrically connected to the ground G. According to an embodiment, the first terminal 401 may be electrically connected to the wireless communication circuit 830 to operate as a feeding structure for providing a radiation current to the first antenna radiator 810. According to an embodiment, the third terminal 403 may be electrically connected to the wireless communication circuit 830 to operate as a feeding structure for providing a radiation current to the second antenna radiator 820. The first terminal 401 may be electrically connected to the wireless communication circuit 830 through a first transmission line 831. The third terminal 403 may be electrically connected to the wireless communication circuit 830 through a second transmission line 832. The transmission line, as a structure for transmitting radio frequency (RF) signals (voltage, current) through an antenna radiator, may be defined to be a conductive system using wave propagation features of electrical elements (e.g., elements having resistance, inductance, conductance, or capacitance per unit length). For example, the first transmission line 831 or the second transmission line 832 may be disposed on the first printed circuit board included in the first substrate assembly 341 shown in FIG. 3.

According to an embodiment, the wireless communication circuit 830 may be configured to transmit or receive a signal penetrating the side member 218 to or from the outside by use of the first antenna radiator 810 or the second antenna radiator 820.

According to various embodiments, the wireless communication circuit 830 may process a transmission signal or a reception signal of at least one designated frequency band through the first antenna radiator 810 or the second antenna radiator 820. For example, the designated frequency band may include at least one of low band (LB, about 600 MHz to about 1 GHz), middle band (MB, about 1 GHz to about 2.3 GHz), high band (HB, about 2.3 GHz to about 2.7 GHz), or ultra high band (UHB, about 2.7 GHz to about 6 GHz).

According to various embodiments (not shown), the wireless communication circuit 830 may include a switch circuit. In an embodiment, the switch circuit may be provided separately from the wireless communication circuit 830. The switch circuit may selectively connect the first transmission line 831 or the second transmission line 832 to the wireless communication circuit 830 under the control of the processor (e.g., processor 120 in FIG. 1). The processor may control the switch circuit based on the usage frequency. According to an embodiment, the switch circuit may be controlled based on the usage frequency so that both the first transmission line 831 and the second transmission line 832 are electrically connected to the wireless communication circuit 830.

In various embodiments (not shown), the antenna device 800 of FIG. 8 may further include a frequency adjustment circuit (e.g., tuner or passive element) electrically connected to the first transmission line 831 or the second transmission line 832.

According to various embodiments (not shown), a circuit for protecting the internal circuits from an external electric shock may be connected to the antenna device 800. For example, the external electrical shock may be static electricity introduced due to electrostatic discharge (ESD), and the electrical path between the second terminal 402 and the ground G or between the fourth terminal 404 and the ground G may be electrically connected to an element such as a varistor capable of absorbing static electricity.

Figure 9:
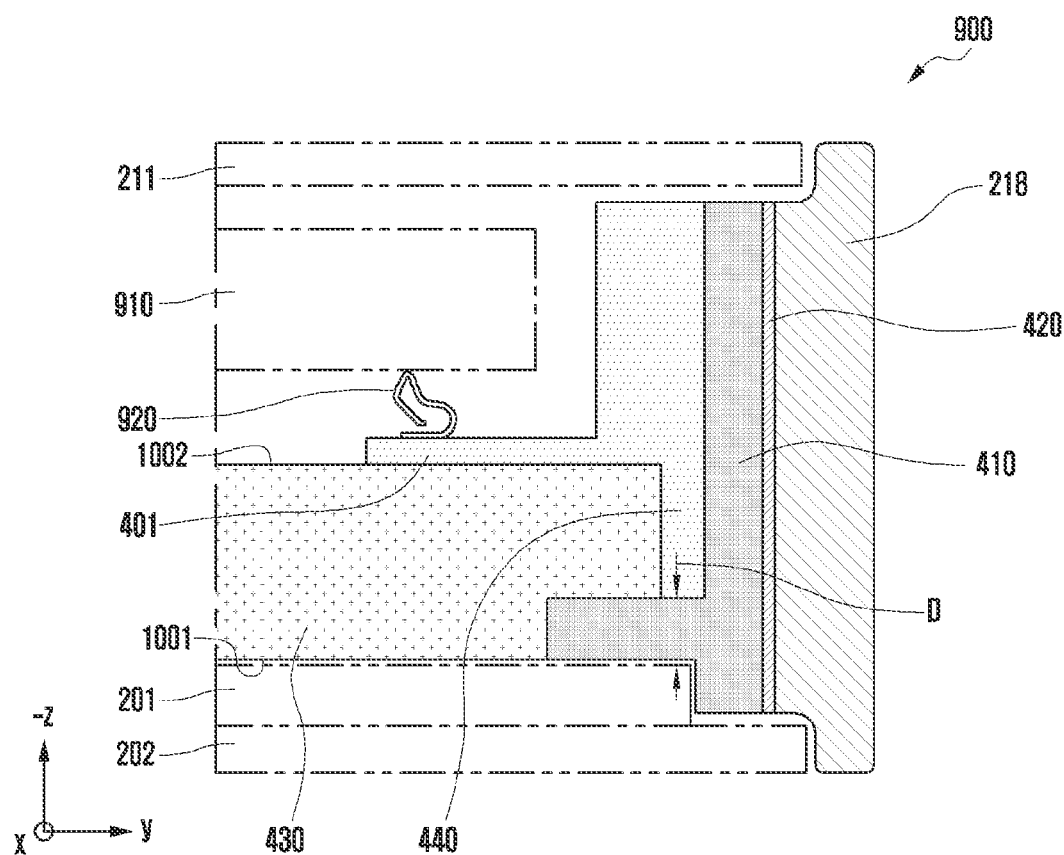
FIG. 9 is a cross-sectional view taken along line C-C' in the frame structure of FIG. 4 according to various embodiments.

FIG. 9 is a cross-sectional view 900 taken along line C-C' in the frame structure 400 of FIG. 4 according to various embodiments.

With reference to FIGS. 4 and 9, in an embodiment, the cross-sectional structure 900 may include a side member 218, a first non-conductive member 410, a bonding member 420, a second non-conductive member 430, a first conductive member 440, or a flexible conductive member 920. The display 201, the front plate 202, the rear plate 211, or the printed circuit board 910 may be disposed in the frame structure 400 of FIG. 4. A description of some reference symbols in FIG. 9 may not be repeated.

According to an embodiment, the printed circuit board 910 (e.g., first printed circuit board included in the first substrate assembly 341 in FIG. 3) may be electrically connected to the first terminal 401 of the first conductive member 440 through the flexible conductive member 920. The flexible conductive member 920 may be electrically connected to the wireless communication circuit (e.g., wireless communication circuit 830 in FIG. 8) disposed on the printed circuit board 910. The flexible conductive member 920 may include, for example, a C clip (e.g., C-shaped spring), a pogo-pin, a spring, a conductive phorone, conductive rubber, conductive tape, or copper connector. The first conductive member 440 and the printed circuit board 910 may be electrically connected through various other ways. For example, the printed circuit board 910 and the first support member 311 (e.g., first support member 311 in FIG. 3) may be coupled with a bolt, and the bolt may electrically connect between the printed circuit board 910 and the first conductive member 440. As another example, the first conductive member 440 may be electrically connected to the printed circuit board 910 through an electrical path using an FPCB or a cable. Although not shown, the second terminal 402, the third terminal 403, or the fourth terminal 404 in FIG. 4 or 8 may be electrically connected to the printed circuit board 910 in the same manner as in the embodiment of FIG. 9.

According to various embodiments, the position or shape of the first terminal 401, the second terminal 402, the third terminal 403, or the fourth terminal 404 may be varied without being limited to the embodiment of FIG. 4, 8 or 9. With reference to FIG. 8, when the wireless communication circuit 830 supplies a radiation current to the feeding structure (e.g., first terminal 401 or third terminal 403), the antenna device 800 may form a signal path between the feeding structure and the ground portion (e.g., position on the ground (G) to which the second terminal 402 or the fourth terminal 404 is connected). The antenna device 800 may form an electrical path (e.g., whose length expressed as a fraction of the wavelength) through the feeding structure and the ground portion, and may operate at a resonance frequency corresponding to its electrical length. The electrical length may vary depending on the position of the terminal (e.g., first terminal 401, second terminal 402, third terminal 403, or fourth terminal 404).

According to an embodiment, the side member 218 may affect the antenna radiation performance of the first conductive member 440 used as an antenna radiator. For example, the side member 218 may include a ceramic. The electromagnetic wave radiated from the first conductive member 440 may pass through the ceramic, but the dielectric constant of the ceramic may affect the antenna radiation performance of the first conductive member 440. In consideration of electromagnetic effects due to the dielectric constant of the ceramic, tuning may be performed with respect to the frequency to be transmitted and/or received through the first conductive member 440. For example, a tuner or a frequency adjustment circuit based on passive elements such as a capacitor may be included in the antenna device (e.g., antenna device 800 of FIG. 8). For another example, the antenna radiation pattern may be adjusted based on various parameters such as the shape of the first conductive member 440, the spatial position relationship between the first conductive member 440 and the side member 218, or the thickness of the side member 218. According to various embodiments, considering that the antenna radiation performance of the first conductive member 440 can be secured when the dielectric constant of the side member 218 is low, the side member 218 may be implemented with a variety of other non-conductive materials (e.g., low-dielectric polymer).

Figure 10:
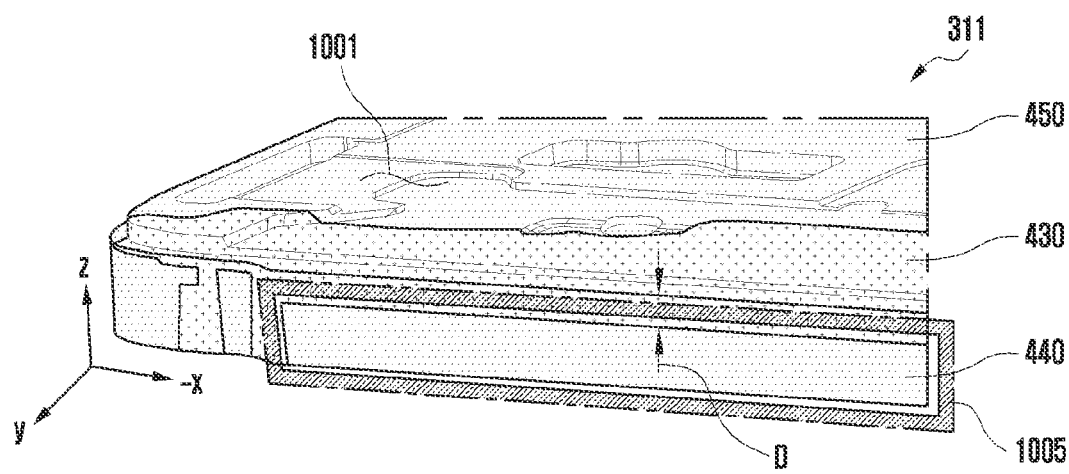
FIG. 10 is a partial perspective view illustrating a first support member according to various embodiments.

FIG. 10 is a partial perspective view illustrating the first support member 311 according to various embodiments.

With reference to FIG. 10, in an embodiment, the first support member 311 may include a second non-conductive member 430, a first conductive member 440, or a second conductive member 450. A description of some reference symbols in FIG. 10 may not be repeated.

With reference to FIGS. 9 and 10, for example, the first support member 311 may include one surface 1001 facing the display 201 and the other surface 1002 facing the printed circuit board 910. According to an embodiment, the first conductive member 440 used as an antenna radiator may be positioned to be spaced apart from the display 201 in the z-axis direction. The display 201 may be disposed on the one surface 1001 of the first support member 311, and the separation distance D in the z-axis direction between the first conductive member 440 and the display 201 may substantially correspond to a distance between the one surface 1001 of the first support member 311 and one surface of the first conductive member 440. At least one conductive material (e.g., Cu sheet for electromagnetic shielding) included in the display 201 may affect the electromagnetic field formed by the first conductive member 440. The separation distance D may be formed to reduce an electromagnetic influence of at least one conductive material included in the display 201 on the first conductive member 440. The separation distance D may be designed based on the wavelength related to the usage frequency. Thereby, the first conductive member 440 being an antenna radiator may be electromagnetically isolated from the display 201. According to an embodiment, the separation distance D may be about 1.0 mm to about 3.0 mm. A signal may be transmitted or received in at least one designated frequency band (e.g., LB, MB, HB, or UHB) through the first conductive member 440. The separation distance D may contribute to securing antenna radiation performance at, for example, about 80 MHz of LB or about 2000 MHz of MB.

According to various embodiments, the frame structure 400 (refer to FIG. 4) may further include a wave trap that provides a boundary condition for the radio wave radiated from the first conductive member 440. At least one conductor 1005 may surround at least the first conductive member 440 when viewed toward the side member 218 (see FIG. 9). The at least one conductor 1005 may reduce a surface wave guided to the side member 218. The at least one conductor 1005 may be positioned to be physically separated from the first conductive member 440 between the side member 218 and the first conductive member 440. The at least one conductor 1005 may change the boundary condition of the radio wave with respect to the side member 218 to thereby reduce deformation or distortion of the radio wave. The at least one conductor 1005 may suppress a surface wave or reduce a disturbance wave. The at least one conductor 1005 may act as a reflector to enhance radiation in a direction of maximum radiation (boresight). The first conductive member 440 may be implemented in various other forms without being limited to the embodiment of FIG. 10.

Figure 11:
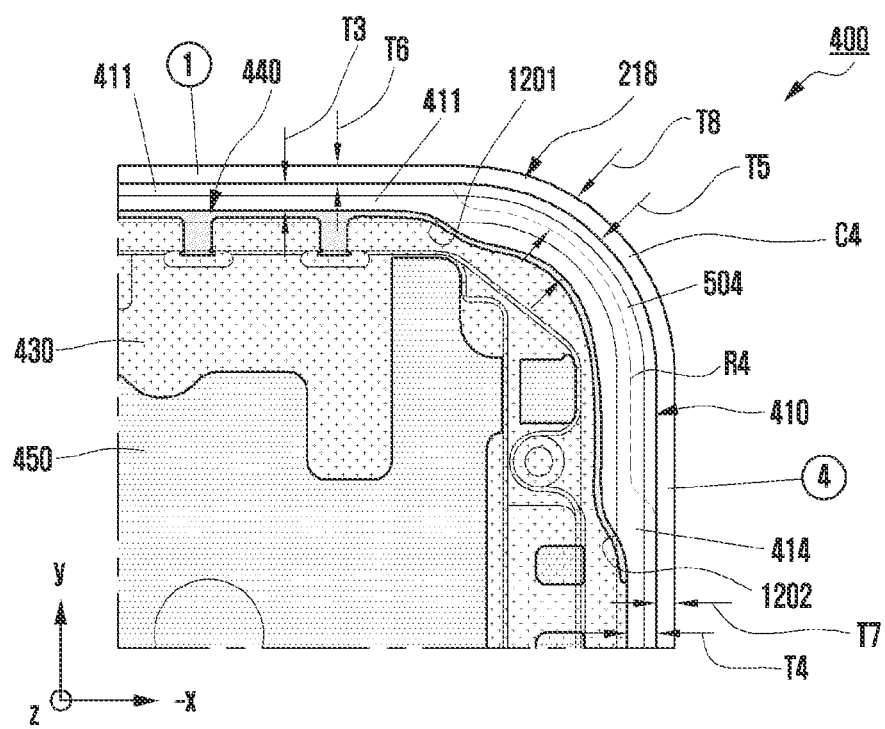
FIG. 11 is a diagram illustrating a portion of the frame structure of FIG. 4 according to various embodiments
Figure 12:
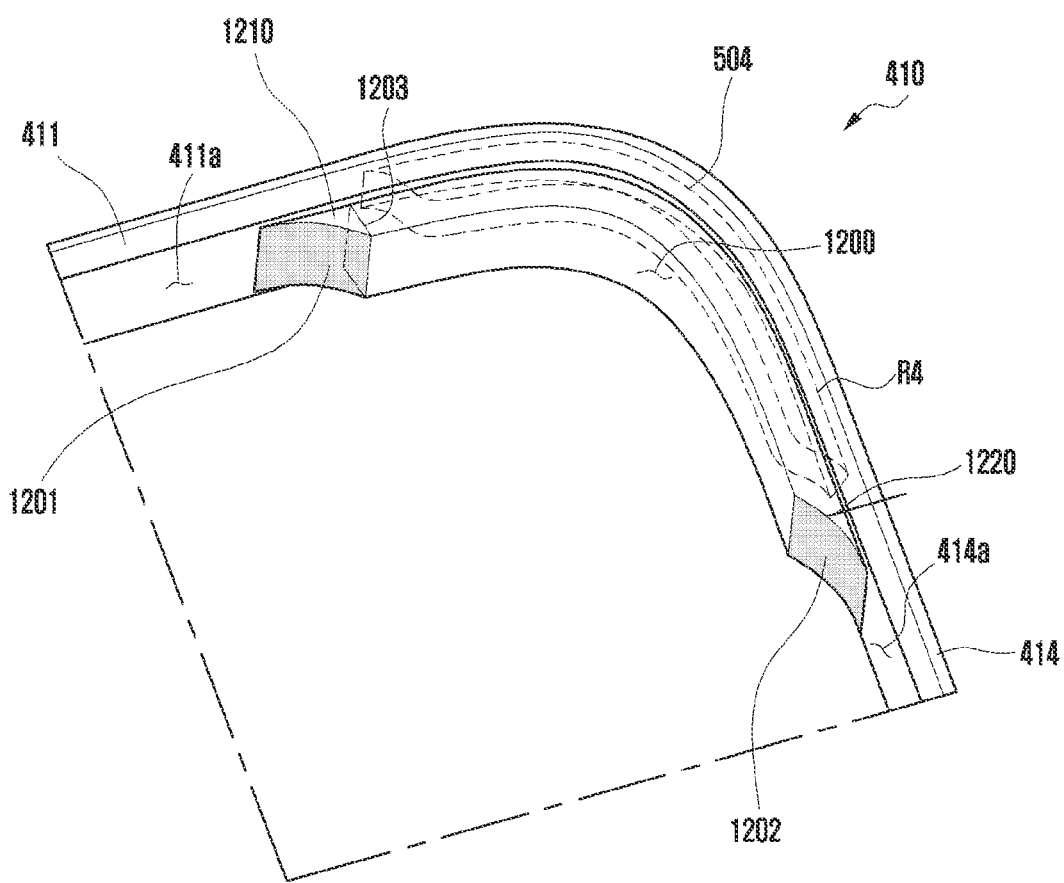
FIG. 12 is a partial perspective view illustrating a portion of the non-conductive member of FIG. 11 according to various embodiments.

FIG. 11 is a diagram illustrating a portion of the frame structure 400 of FIG. 4 according to various embodiments. FIG. 12 is a partial perspective view illustrating a portion of the first non-conductive member 410 of FIG. 11 according to various embodiments.

With reference to FIG. 11, in an embodiment, the frame structure 400 may include a side member 218, a first non-conductive member 410, a second non-conductive member 430, a first conductive member 440, or a second conductive member 450. A description of some reference symbols in FIG. 11 may not be repeated.

With reference to FIGS. 11 and 12, in an embodiment, when viewed in the z-axis direction, the first part 411 of the first non-conductive member 410 corresponding to the first side part ① of the side member 218 may be formed to have a first thickness T3. When viewed in the z-axis direction, the fourth part 414 of the first non-conductive member 410 corresponding to the fourth side part ④ of the side member 218 may be formed to have a second thickness T4. When viewed in the z-axis direction, the fourth corner portion 504 of the first non-conductive member 410 corresponding to the fourth corner C4 of the side member 218 may be formed to have a third thickness T5. The third thickness T5 may be greater than the first thickness T3 and/or the second thickness T4. The first thickness T3 and the second thickness T4 may be substantially the same, or may be different from each other in a certain case. According to an embodiment, the third thickness T5 may be about 4 mm or less. The first thickness T3 or the second thickness T4 may be about 3 mm or less. If the third thickness T5 is formed not to be greater than the first thickness T3 or the second thickness T4, the fourth corner portion 504 may be more likely to be damaged by an external impact than the first part 411 or the fourth part 414. It may be more difficult for the fourth corner portion 504 to disperse an external impact than, for example, the first part 411 or the fourth part 414. The structure in which the fourth corner portion 504 is formed to have a greater thickness than the first part 411 and the fourth part 414 when viewed in the z-axis direction may reduce the damage of the fourth corner portion 504 due to external impact. Referring to FIG. 5, when viewed in the z-axis direction, the first corner portion 501 may be formed to have a greater thickness than the first part 411 and the second part 412 in substantially the same way as in the embodiments of FIGS. 11 and 12. When viewed in the z-axis direction, the second corner portion 502 may be formed to have a greater thickness than the second part 412 and the third part 413 in substantially the same way as in the embodiments of FIGS. 11 and 12. When viewed in the z-axis direction, the third corner portion 503 may be formed to have a greater thickness than the third part 413 and the fourth part 414 in substantially the same way as in the embodiments of FIGS. 11 and 12.

According to an embodiment, the first non-conductive member 410 may include a rib 1210 formed at a boundary portion between the first part 411 and the fourth corner portion 504. The rib 1210 may have an inclined surface 1201 connecting the surfaces 411a and 1200 having different heights due to the thickness difference between the first part 411 and the fourth corner portion 504. The first non-conductive member 410 may include a rib 1220 formed at a boundary portion between the fourth part 414 and the fourth corner portion 504. The rib 1220 may have an inclined surface 1202 connecting the surfaces 414a and 1200 having different heights due to the thickness difference between the fourth part 414 and the fourth corner portion 504. The inclined surfaces 1201 and 1202 may be formed, for example, as a curved surface. The rib 1210 may serve as a support part that prevents/reduces the boundary portion between the first part 411 and the fourth corner portion 504 having different thicknesses from being damaged by an external impact. For example, if the boundary portion between the first part 411 and the fourth corner portion 504 is formed without the rib 1210 as indicated by indicia 1203, stress due to an external impact may be concentrated on the boundary portion between the first part 411 and the fourth corner portion 504 having different thicknesses. The boundary portion between the first part 411 and the fourth corner portion 504 having different thicknesses may have resistance to withstand an external impact thanks to the rib 1210. The rib 1220 may provide a resistance force that enables the boundary portion between the fourth part 414 and the fourth corner portion 1200 having different thicknesses to withstand an external impact.

With reference to FIG. 5, the first non-conductive member 410 may include a rib formed at a portion where the first corner portion 501 is connected to the first part 411 or the second part 412 in substantially the same way as in the embodiments of FIGS. 11 and 12. The first non-conductive member 410 may include a rib formed at a portion where the second corner portion 502 is connected to the second part 412 or the third part 413 in substantially the same way as in the embodiments of FIGS. 11 and 12. The first non-conductive member 410 may include a rib formed at a portion where the third corner portion 503 is connected to the third part 413 or the fourth part 414 in substantially the same way as in the embodiments of FIGS. 11 and 12. The first support member 311 may be formed in a shape laterally surrounded by the first non-conductive member 410, and the side portion of the support member 311 may include concave recesses or grooves in correspondence to the inclined surfaces of the ribs.

Figure 13:
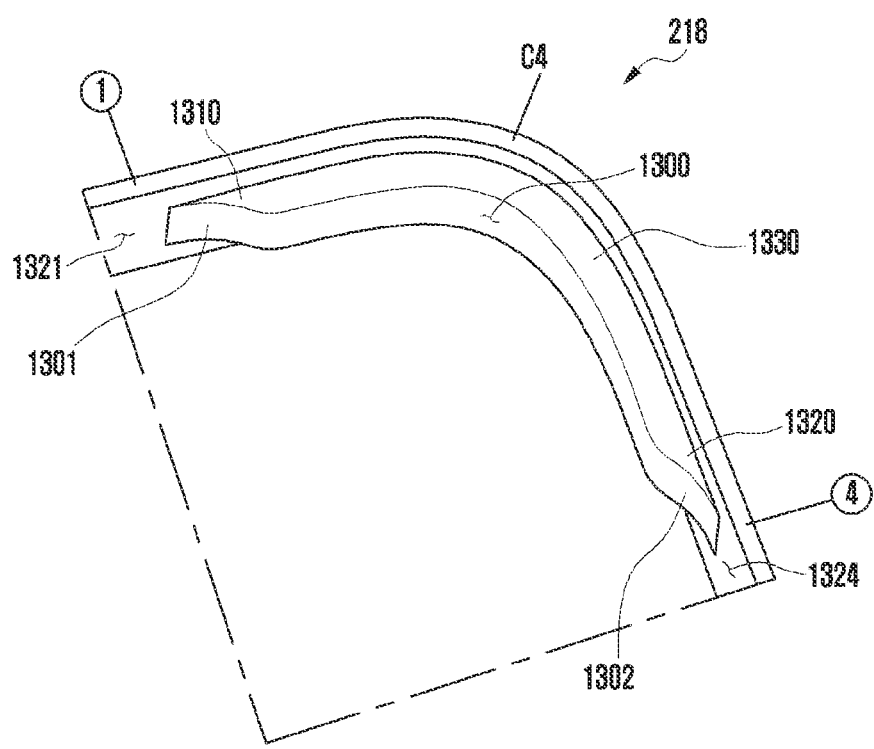
FIG. 13 is a partial perspective view illustrating a portion of the side member of FIG. 11 according to various embodiments.

FIG. 13 is a partial perspective view illustrating a portion of the side member 218 of FIG. 11 according to various embodiments.

With reference to FIGS. 11 and 13, in an embodiment, when viewed in the z-axis direction, the first side part ① of the side member 218 may be formed to have a fourth thickness T6. The fourth side part ④ of the side member 218 may be formed to have a fifth thickness T7. When viewed in the z-axis direction, the fourth corner C4 of the side member 218 may be formed to have a sixth thickness T8. The sixth thickness T8 may be greater than the fourth thickness T6 and/or the fifth thickness T7. The fourth thickness T6 and the fifth thickness T7 may be substantially the same, or may be different from each other in a certain case. If the sixth thickness T8 is formed not to be greater than the fourth thickness T6 and the fifth thickness T7, the fourth corner C4 may be more likely to be damaged by an external impact than the first side part ① or the fourth side part ④. The structure in which the fourth corner C4 is formed to have a greater thickness than the first side part ① and the fourth side part ④ when viewed in the z-axis direction can reduce the damage of the fourth corner C4 due to an external impact. With reference to FIG. 4, when viewed in the z-axis direction, the first corner C1 may be formed to have a greater thickness than the first side part ① and the second side part ② in substantially the same manner as in the embodiments of FIGS. 11 and 13. When viewed in the z-axis direction, the second corner C2 may be formed to have a greater thickness than the second side part ② and the third side part ③ in substantially the same manner as in the embodiments of FIGS. 11 and 13. When viewed in the z-axis direction, the third corner C3 may be formed to have a greater thickness than the third side part ③ and the fourth side part ④ in substantially the same manner as in the embodiments of FIGS. 11 and 13.

With reference to FIGS. 5 and 12, in an embodiment, the first non-conductive member 410 may include a first recess (not shown) formed in the first corner portion 501, a second recess R2 formed in the second corner portion 502, a third recess R3 formed in the third corner portion 503, or a fourth recess R4 formed in the fourth corner portion 504. The fourth corner C4 may include a fourth part 1330 (see FIG. 13) filled in the fourth recess R4, and the fourth corner C4 may have a greater thickness than the first side part ① and the fourth side part ④ when viewed in the z-axis direction due to the fourth part 1330. The first corner C1 may include a first part (not shown) filled in the first recess, and the first corner C1 may have a greater thickness than the first side part ① and the second side part ② when viewed in the z-axis direction due to the first part. The second corner C2 may include a second part (not shown) filled in the second recess R2, and the second corner C2 may have a greater thickness than the second side part ② and the third side part ③ when viewed in the z-axis direction due to the second part. The third corner C3 may include a third part (not shown) filled in the third recess R3, and the third corner C3 may have a greater thickness than the third side part ③ and the fourth side part ④ when viewed in the z-axis direction due to the third part. The first recess and the first part corresponding thereto, the second recess R2 and the second part corresponding thereto, or the third recess R3 and the third part corresponding thereto may be implemented in substantially the same manner as the fourth recess R4 and the fourth part 1330 corresponding thereto.

With reference to FIG. 13, in various embodiments, the side member 218 may include a rib 1310 formed at a boundary portion between the first side part ① and the fourth corner C4. The rib 1310 may have an inclined surface 1301 connecting the surfaces 1321 and 1300 having different heights due to the thickness difference between the first side part ① and the fourth corner C4. The side member 218 may include a rib 1320 formed at a boundary portion between the fourth side part ④ and the fourth corner C4. The rib 1320 may have an inclined surface 1302 connecting the surfaces 1324 and 1300 having different heights due to the thickness difference between the fourth side part ④ and the fourth corner C4. The rib 1310 may serve as a support portion that prevents/reduces the boundary portion between the first side part ① and the fourth corner C4 having different thicknesses from being damaged by an external impact, and may prevent and/or reduce an external impact from being concentrated on the boundary portion between the first side part ① and the fourth corner C4. The rib 1320 may serve as a support portion that prevents/reduces the boundary portion between the fourth side part ④ and the fourth corner C4 having different thicknesses from being damaged by an external impact, and may prevent and/or reduce an external impact from being concentrated on the boundary portion between the fourth side part ④ and the fourth corner C4. With reference to FIG. 4, the side member 218 may include a rib formed at a portion where the first corner C1 is connected to the first side part ① or the second side part ② in substantially the same manner as in the embodiment of FIG. 13. The side member 218 may include a rib formed at a portion where the second corner C2 is connected to the second side part ② or the third side part ③ in substantially the same manner as in the embodiment of FIG. 13. The side member 218 may include a rib formed at a portion where the third corner C3 is connected to the third side part ③ or the fourth side part ④ in substantially the same manner as in the embodiment of FIG. 13.

Figure 14:
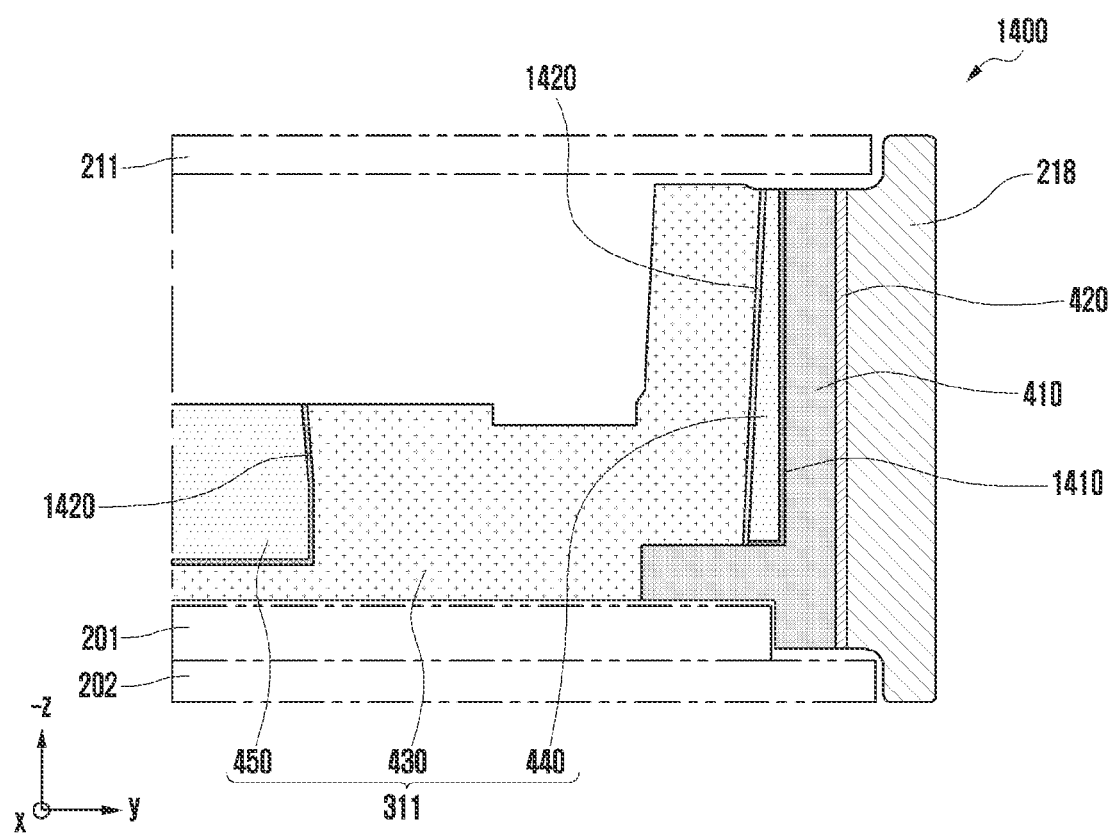
FIG. 14 is a cross-sectional view taken along line A-A' or line B-B' in the frame structure of FIG. 4 according to various embodiments.

FIG. 14 is a cross-sectional view 1400 taken along line A-A' or line B-B' in the frame structure 400 of FIG. 4 according to various embodiments.

With reference to FIG. 14, in an embodiment, the cross-sectional structure 1400 may include a side member 218, a first support member 311, a first non-conductive member 410, a bonding member 420, a first organic adhesive layer 1410, or a second organic adhesive layer 1420. The display 201 and the front plate 202 may be positioned on one side of the frame structure 400 of FIG. 4, and the rear plate 211 may be positioned on the other side of the frame structure 400. A description of some reference symbols in FIG. 14 may not be repeated.

According to an embodiment, the first organic adhesive layer 1410 may be positioned between the first non-conductive member 410 and the first conductive member 440. The first conductive member 440 may be firmly and tightly bonded to the first non-conductive member 410 formed via injection molding due to the first organic adhesive layer 1410. The first organic adhesive layer 1410 may increase the bonding force between the first non-conductive member 410 and the first conductive member 440, and may contribute to waterproofing.

According to an embodiment, the second organic adhesive layer 1420 may be positioned between the second non-conductive member 430 and the first conductive member 440 and/or between the second non-conductive member 430 and the second conductive member 450. The first conductive member 440 and the second conductive member 450 may be firmly and tightly bonded to the second non-conductive member 430 formed via injection molding due to the second organic adhesive layer 1420. The second organic adhesive layer 1420 may increase the bonding force between the second non-conductive member 430 and the first conductive member 440 and the bonding force between the second non-conductive member 430 and the second conductive member 450, and may contribute to waterproofing. According to an embodiment, the second non-conductive member 430 and the second conductive member 450 may be coupled without the second organic adhesive layer 1420.

According to an embodiment, with reference to FIGS. 4 and 14, the frame structure 400 may be fabricated through a first operation of forming a metal bracket including a first conductive member 440 and a second conductive member 450, a second operation of processing the outer shape of the metal bracket (e.g., outer shape machining using CNC), a third operation of applying a second organic adhesive layer 1420 to the metal bracket, a fourth operation of forming a second non-conductive member 430 on the metal bracket for antenna segmentation, a fifth operation of applying a first organic adhesive layer 1410 to the metal bracket, and an operation of applying a bonding member 420 to the side member 218 and forming the first non-conductive member 410. According to an embodiment, the first organic adhesive layer 1410 or the second organic adhesive layer 1420 may be applied to the metal bracket by flowing a current through an electrolyte solution (e.g., sulfuric acid solution or nitric acid solution). Due to the scheme of applying an organic adhesive layer to the metal bracket by flowing an electric current through an electrolyte solution, in the frame structure 400 of FIG. 4 having a cross-sectional structure 1400 according to the embodiment of FIG. 14, metal oxide and/or carbon may be included in the first organic adhesive layer 1410 or the second organic adhesive layer 1420. For example, in case that the metal bracket includes aluminum (Al), due to the scheme of applying an organic adhesive layer to the metal bracket by flowing an electric current through an electrolyte solution, when a composition analysis is performed on the first organic adhesive layer 1410 or the second organic adhesive layer 1420 of the frame structure 400 of FIG. 4 having a cross-sectional structure 1400 according to the embodiment of FIG. 14, aluminum, oxygen, and/or carbon may be detected.

Figure 15:
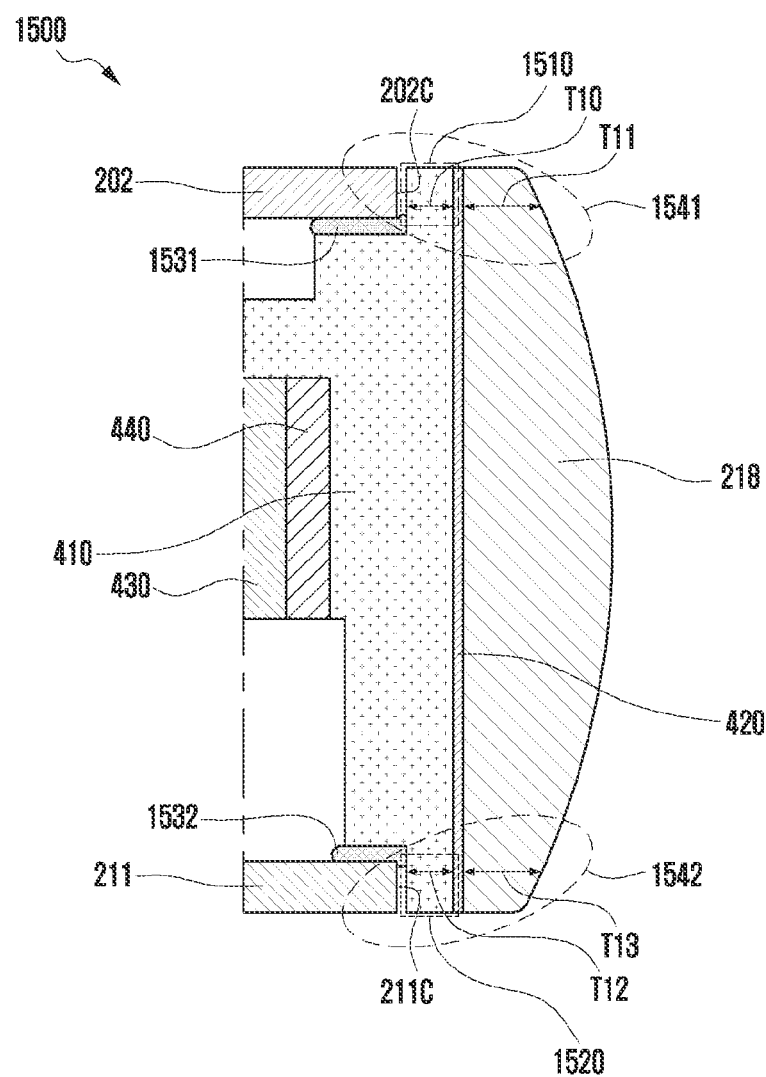
FIG. 15 is a cross-sectional view of a portion of the electronic device of FIG. 2A according to various embodiments.

FIG. 15 is a cross-sectional view 1500 of a portion of the electronic device 200 of FIG. 2A according to various embodiments.

With reference to FIG. 15, in an embodiment, the cross-sectional structure 1500 may include a side member 218, a first non-conductive member 410, a second non-conductive member 430, a first conductive member 440 (e.g., first antenna radiator 810 or second antenna radiator 820 in FIG. 8), a bonding member 420, a front plate 202, or a rear plate 211. A repeated description of some reference symbols in FIG. 14 will be omitted.

According to an embodiment, the front plate 202 may be coupled to one side of the first non-conductive member 410 through a bonding material 1531 (e.g., double-sided tape). The rear plate 211 may be coupled to the other side of the first non-conductive member 410 through a bonding material 1532 (e.g., double-sided tape).

According to an embodiment, the side member 218 may be extended to cover a side surface 202C of the front plate 202, and the first non-conductive member 410 may include a first portion 1510 extended between the side surface 202C of the front plate 202 and the side member 218. For example, in response to an external impact caused by such a situation where the electronic device 200 of FIG. 2A is dropped, the first portion 1510 may prevent and/or reduce damage to the front plate 202 by mitigating the external impact between the front plate 202 and the side member 218. For example, although the front plate 202 may include glass having brittleness and an external impact may be applied to the connection portion 1541 between the front plate 202 and the side member 218 due to a drop, the first portion 1510 may provide a resistive force that enables the front plate 202 to withstand the external impact while preventing/reducing the external impact from being concentrated toward the front plate 202.

According to an embodiment, the side member 218 may be extended to cover a side surface 211C of the rear plate 211, and the first non-conductive member 410 may include a second portion 1520 extended between the side surface 211C of the rear plate 211 and the side member 218. For example, in response to an external impact caused by such a situation where the electronic device 200 of FIG. 2A is dropped, the second portion 1520 may prevent and/or reduce damage to the rear plate 211 by mitigating the external impact between the rear plate 211 and the side member 218. For example, although the rear plate 211 may include glass having brittleness and an external impact may be applied to the connection portion 1542 between the rear plate 211 and the side member 218 due to a drop, the second portion 1520 may provide a resistive force that enables the rear plate 211 to withstand the external impact while preventing/reducing the external impact from being concentrated toward the rear plate 211.

According to an embodiment, the thickness T10 of the first portion 1510 positioned between the front plate 202 and the side member 218 or the thickness T11 of a portion (not shown) of the side member 218 facing the first portion 1510 may be about 0.5 mm, but, without being limited thereto, it may be implemented in various ways in consideration of impact resistance, mass productivity, or aesthetics of the connection portion 1541 between the front plate 202 and the side member 218. The thickness T12 of the second portion 1520 positioned between the rear plate 211 and the side member 218 or the thickness T13 of a portion (not shown) of the side member 218 facing the second portion 1520 may be about 0.5 mm, but, without being limited thereto, it may be implemented in various ways in consideration of impact resistance, mass productivity, or aesthetics of the connection portion 1542 between the rear plate 211 and the side member 218.

Figure 16:
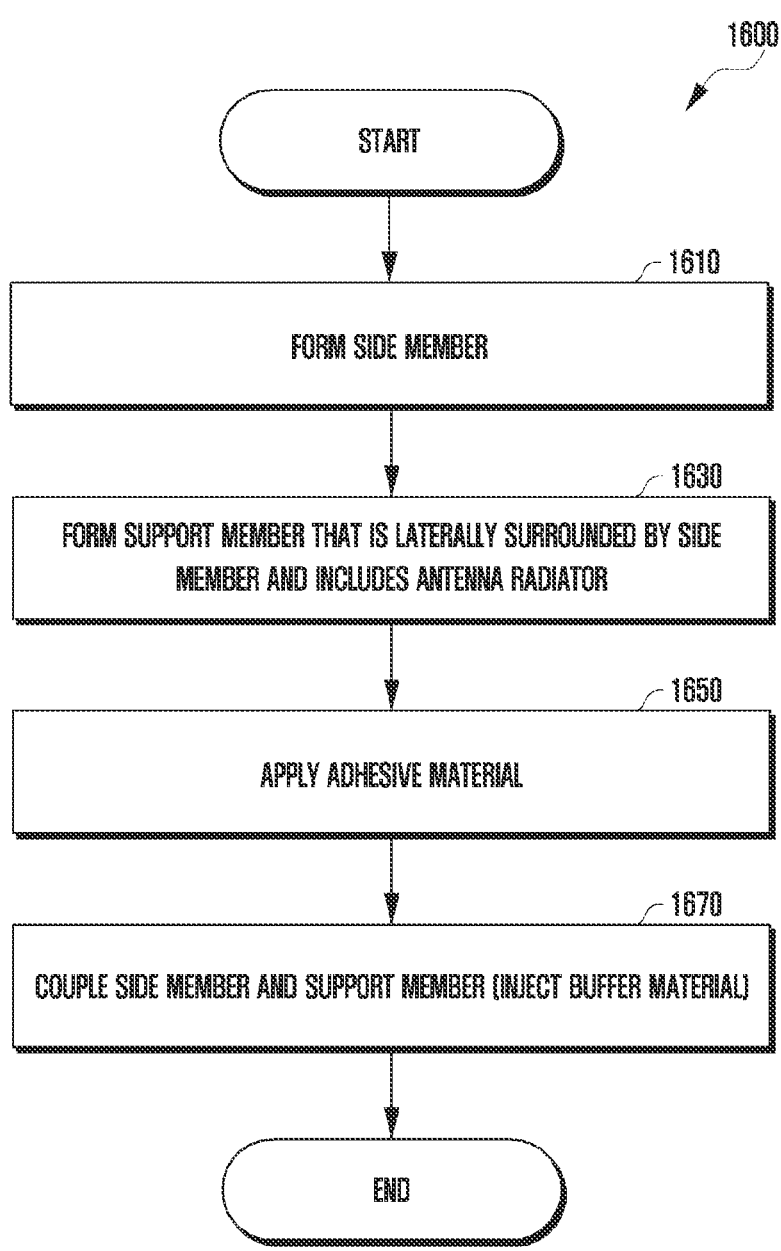
FIG. 16 is a flowchart illustrating an example method of fabricating the frame structure of FIG. 4 according to various embodiments.

FIG. 16 is a flowchart 1600 illustrating an example method of fabricating the frame structure 400 of FIG. 4 according to various embodiments.

With reference to FIGS. 4, 6 and 16, in an embodiment, at operation 1610, a side member 418 may be formed. The side member 418 may include the side surface 210C of the electronic device 200 in FIG. 2A. According to an embodiment, the side member 418 may include a ceramic.

According to an embodiment, at operation 1630, a support member (e.g., first support member 311 in FIG. 4) that is laterally surrounded by the side member 418 and includes an antenna radiator may be formed. The antenna radiator may include, for example, the first conductive member 440 in FIG. 6. The antenna radiator may include, for example, the first antenna radiator 810 and/or the second antenna radiator 820 in FIG. 8 implemented using the first conductive member 440 in FIG. 6. According to various embodiments, operation 1630 may precede operation 1610, or operation 1610 and operation 1630 may be performed in parallel.

According to an embodiment, at operation 1650, an adhesive material may form the adhesive member 420 in FIG. 6, and may be applied to the side member 218. According to an embodiment, the adhesive material may be applied to the support member (e.g., first support member 311 in FIG. 4 or 6). According to an embodiment, the adhesive material may be applied to both the side member 218 and the support member 311.

According to an embodiment, at operation 1670, the side member 218 and the support member (e.g., first support member 311 in FIG. 4 or 6) may be coupled together. For example, at operation 1670, the adhesive material is applied to at least one of the side member 218 or the support member 311, and a buffer material is injected through injection molding and cured, so that the first non-conductive member 410 may be formed between the side member 218 and the support member 311.

Figure 17:
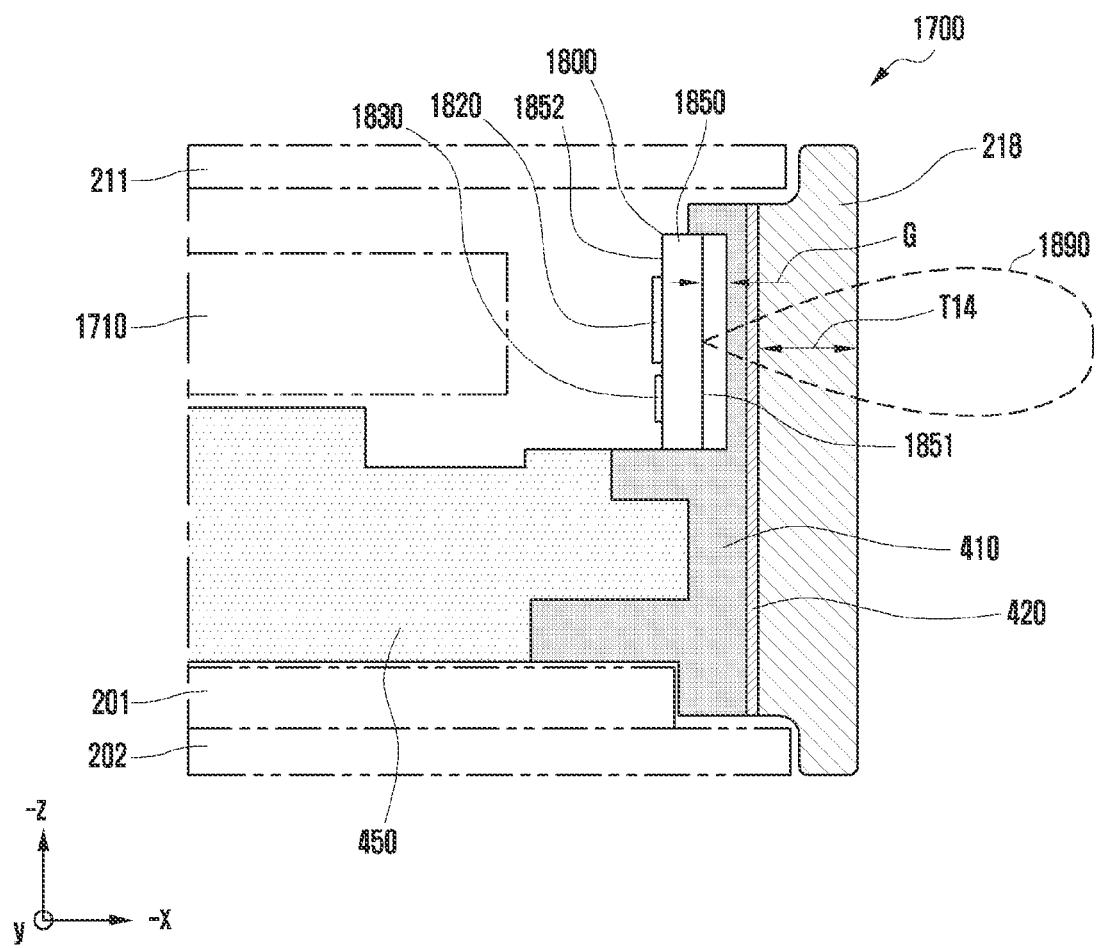
FIG. 17 is a cross-sectional view of a portion of the electronic device of FIG. 2A according to various embodiments.
Figure 18:
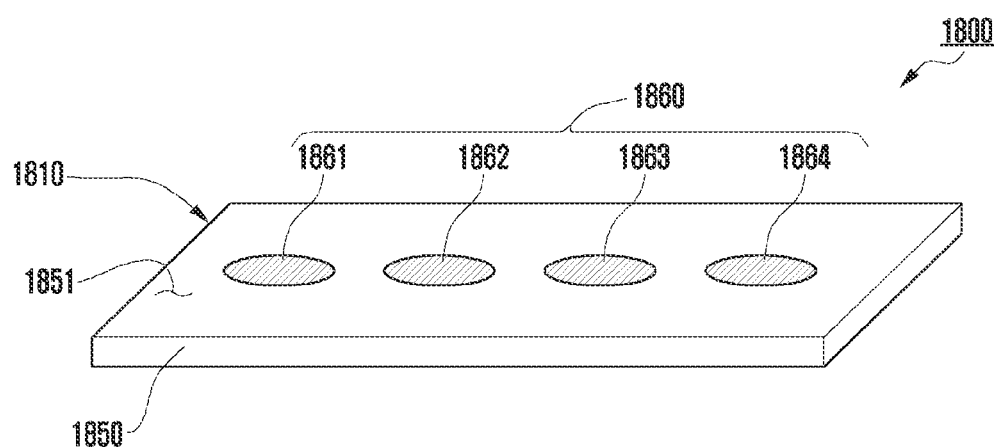
FIG. 18 and FIG. 19 are perspective views illustrating an example antenna module according to various embodiments.
Figure 19:
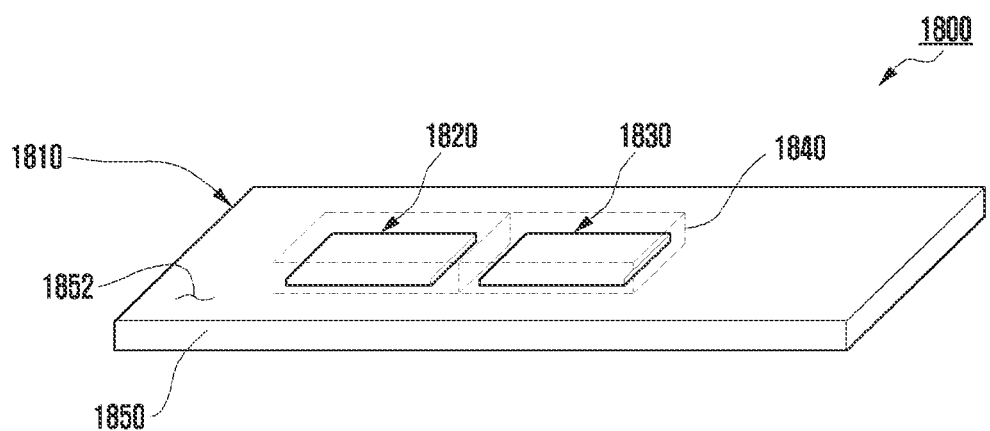

FIG. 17 is a cross-sectional view 1700 illustrating a portion of the electronic device 200 of FIG. 2A according to various embodiments. FIG. 18 and FIG. 19 are perspective views of an example antenna module 1800 according to various embodiments.

With reference to FIG. 17, in an embodiment, the cross-sectional structure 1700 may include a side member 218, a first non-conductive member 410, a bonding member 420, a second conductive member 450, a display 201, a front plate 202, a rear plate 211, a first printed circuit board 1710 (e.g., first printed circuit board included in the first substrate assembly 341 in FIG. 3), or an antenna module 1800. A repeated description of some reference symbols in FIG. 17 will be omitted.

With reference to FIGS. 17, 18 and 19, in an embodiment, the antenna module 1800 may include an antenna structure 1810, a wireless communication circuit 1820, or a power management circuit 1830.

According to an embodiment, the antenna structure 1810 may include a fourth printed circuit board 1850 on which an antenna array 1860 is disposed. The fourth printed circuit board 1850 may include a first surface 1851 and a second surface 1852 facing in a direction opposite to that of the first surface 1851. The antenna array 1860 may include a plurality of antenna elements 1861, 1862, 1863 and 1864 disposed on the first surface 1851, or disposed closer to the first side 1851 than the second side 1852 inside the fourth printed circuit board 1850.

According to an embodiment, the plurality of antenna elements 1861, 1862, 1863 and 1864 may have substantially the same shape and may be disposed at regular intervals. As another example, the plurality of antenna elements 1861, 1862, 1863 and 1864 may transmit and/or receive signals of substantially the same frequency band. The fourth printed circuit board 1850 may include a plurality of conductive layers (e.g., conductive pattern layers) and a plurality of non-conductive layers (e.g., insulating layers) alternately stacked with the conductive layers. The plural antenna elements 1861, 1862, 1863 and 1864 may be implemented with at least some of the plural conductive layers, for example. According to various embodiments, the number or positions of antenna elements included in the antenna array 1860 may be varied without being limited to the embodiment shown in FIG. 18.

According to an embodiment, the plural antenna elements 1861, 1862, 1863 and 1864 may operate as a patch antenna. According to various embodiments, the number or positions of antenna arrays may be varied without being limited to the embodiment shown in FIG. 18. For example (not shown), the antenna module 1800 may further include an antenna array that includes plural antenna elements operating as a dipole antenna. As another example, the plural antenna elements 1861, 1862, 1863 and 1864 may operate as an antenna other than a patch antenna or a dipole antenna.

According to an embodiment, the wireless communication circuit 1820 may be disposed on the second surface 1852 of the fourth printed circuit board 1850 through a conductive bonding member such as solder. For example, the wireless communication circuit 1820 may be electrically connected to the plural antenna elements 1861, 1862, 1863 and 1864 through the wires (e.g., electrical paths made of a conductive pattern or a via) included in the fourth printed circuit board 1850. As another example, the wireless communication circuit 1820 may be disposed on a printed circuit board (e.g., first printed circuit board 1710) other than the fourth printed circuit board 1850. According to an embodiment, the wireless communication circuit 1820 may include a radio frequency integrated circuit (RFIC).

According to an embodiment, the plural antenna elements 1861, 1862, 1863 and 1864 may be fed directly or indirectly from the wireless communication circuit 1820 to operate as an antenna radiator.

According to an embodiment, the plural antenna elements 1861, 1862, 1863 and 1864 may be used as a dummy element (e.g., dummy antenna, dummy patch, or conductive patch). The dummy element may be physically separated from other conductive elements to be in an electrically floating state. The antenna module 1800 may include a plurality of feeding antenna elements (not shown) that at least partially overlap the plural antenna elements 1861, 1862, 1863 and 1864 and are physically separated from the plural antenna elements 1861, 1862, 1863 and 1864 when viewed from above the first surface 1851. The plural feeding antenna elements may be electrically connected to the wireless communication circuit 1820, and the plural antenna elements 1861, 1862, 1863 and 1864 may be indirectly fed from the plural feeding antenna elements to operate as an antenna radiator.

According to an embodiment, the antenna structure 1810 may include a ground plane (or, ground layer) (not shown) implemented with at least some of plural conductive layers included in the fourth printed circuit board 1850. The ground plane may be disposed between the antenna array 1810 and the second surface 1852, and may at least partially overlap the antenna array 1860 when viewed toward the first surface 1851. According to various embodiments (not shown), the antenna module 1800 may further include an antenna array operating as a dipole antenna. In this case, the ground plane included in the fourth printed circuit board 1850 may not overlap the antenna array operating as a dipole antenna.

According to an embodiment, the power management circuit 1830 may be disposed on the second surface 1852 of the fourth printed circuit board 1850 through a conductive bonding member such as solder. As another example, the power management circuit 1830 may be disposed on a printed circuit board (e.g., first printed circuit board 1710) other than the fourth printed circuit board 1850. The power management circuit 1830 may be electrically connected to the wireless communication circuit 1820 or various other elements (e.g., connectors, passive elements) disposed on the fourth printed circuit board 1850 through wires (e.g., electrical paths made of a conductive pattern or a via) included in the fourth printed circuit board 1850. According to an embodiment, the power management circuit 1830 may include a power management integrated circuit (PMIC).

According to various embodiments, the antenna module 1800 may further include a shielding member 1840 that is disposed on the second surface 1852 to surround at least one of the wireless communication circuit 1820 and/or the power management circuit 1830. The shielding member 1840 may electromagnetically shield the wireless communication circuit 1820 and/or the power management circuit 1830. For example, the shielding member 1840 may include a conductive member such as a shield can. As another example, the shielding member 1840 may include a protective member such as a urethane resin and a conductive paint such as an EMI paint applied to the outer surface of the protective member. According to various embodiments, the shielding member 1840 may be implemented with various shielding sheets disposed to cover the second surface 1852.

According to various embodiments (not shown), the antenna module 1800 may further include a frequency adjustment circuit disposed on the fourth printed circuit board 1850. The frequency adjustment circuit such as a tuner or passive element may shift the impedance matching or resonant frequency to a specified frequency, or may shift it by a specified amount.

According to an embodiment, the antenna module 1800 may have a directivity capable of concentrating an electromagnetic wave in a specific direction or transmitting and receiving a wave. Through beamforming, the antenna module 1800 may form a beam pattern (or antenna radiation pattern) by combining beams (or lobes) formed by the plural antenna elements 1861, 1862, 1863 and 1864 of the antenna array 1860. The beam pattern is an effective area in which the antenna array 1860 can radiate or sense an electromagnetic wave, and may be formed by summing the radiated powers of the plural antenna elements 1861, 1862, 1863 and 1864 of the antenna array 1860. The beam pattern may include a main beam (or main lobe) in a direction of maximum radiation (boresight). For example, a main beam 1890 (see FIG. 17) refers to a beam from which a relatively large amount of energy is radiated, and the antenna module 1800 may transmit and/or receive frequency signals substantially via the main beam 1890. The main beam 1890 formed through the antenna array 1860 may be radiated in a direction in which the first surface 1851 faces. According to an embodiment, the first surface 1851 of the fourth printed circuit board 1850 may face the side member 218, and the antenna array 1860 may form a main beam 1890 in a direction toward the side member 218.

In an embodiment, referring to the cross-sectional structure 1700 of FIG. 17, the first non-conductive member 410 may be extended between the first surface 1851 of the antenna module 1800 and the side member 218. The second conductive member 450 may be not extended between the first surface 1851 of the antenna module 1800 and the first non-conductive member 410. The first conductive member 440 of FIG. 6 may be not extended between the first surface 1851 of the antenna module 1800 and the first non-conductive member 410. When viewed toward the side member 218, the first surface 1851 or antenna array 1860 of the antenna module 1800 may not overlap with the first conductive member 440 (see FIG. 6) and the second conductive member 450, which can reduce deterioration in antenna radiation performance of the antenna module 1800. When the antenna module 1800 transmits or receives a frequency signal, the radio wave related to the frequency signal may pass through the first conductive member 410, the bonding member 420, and the side member 218 overlapping each other in a direction in which the main beam 1890 is radiated. The antenna radiation performance of the antenna module 1800 can be secured by substantially eliminating a conductive material placed in a direction in which the main beam 1890 is radiated.

According to an embodiment, when viewed in a direction in which the main beam 1890 is radiated, a portion (not shown) of the first non-conductive member 410 may overlap the antenna array 1860. The first surface 1851 of the antenna module 1800 may be disposed to be spaced apart from the first non-conductive member 410 with an air gap G interposed therebetween. The air gap G may reduce deformation or distortion of a beam pattern formed by the antenna module 1800 or may make it possible to secure coverage (communication range) toward the side member 218.

According to an embodiment, a signal of at least one designated frequency band may be transmitted or received through the antenna module 1800. For example, the designated frequency band may include a high frequency band (e.g., mmWave band of about 6 GHz to about 100 GHz).

According to an embodiment, the antenna module 1800 may be electrically connected to a first printed circuit board 1710 through a flexible printed circuit board (FPCB) or a cable. For example, the communication circuit (not shown) disposed on the first printed circuit board 1710 and the wireless communication circuit 1820 of the antenna module 1800 may exchange and process frequency signals.

According to an embodiment, the side member 218 may include a ceramic. The electromagnetic wave radiated by the antenna module 1800 may pass through the ceramic, but the dielectric constant of the ceramic may affect the antenna radiation performance. For example, the radio wave radiated from the antenna module 1800 may be guided through the side member 218 to generate a surface wave, and the surface wave may cause deformation or distortion of the beam pattern or reduce the beam coverage (communication range). For example, surface waves may cause power loss, which may degrade antenna radiation performance. For example, at least a portion of the electromagnetic field formed by the antenna module 1800 may be reflected from the side member 218, and the reflected component may compensate for and/or interfere with the main beam 1890, resulting in deformation (or distortion) of the beam pattern. When a radio wave having high straightness or high sensitivity to path loss, such as a millimeter wave (mmWave), is transmitted or received through the antenna module 1800, the possibility that a surface wave is guided through the side member 218 may be high. According to an embodiment, in consideration of the electromagnetic effect due to the dielectric constant of the ceramic, tuning may be performed on the frequency to be transmitted and/or received through the antenna module 1800. While the side member 218 of a thin thickness T14 may be advantageous in securing the antenna radiation performance of the antenna module 1800, the strength of the side member 218 must also be secured in response to an external impact caused by such a situation where the electronic device 200 of FIG. 2A is dropped, so that the thickness T14 may be, for example, about 1 mm to about 2 mm or less. The radio wave radiated by the antenna module 1800 may be not substantially induced or leaked to the side member 218 due to the thickness T14, thereby ensuring antenna radiation performance. According to various embodiments, the thickness T14 of the side member 218 may be formed in various ways according to the material thereof, and the thickness T14 may be designed in consideration of damage due to an external impact. According to various embodiments, the shapes (e.g., thickness) or materials of the first conductive member 410 and/or the bonding member 420 disposed in a direction in which the main beam 1890 is radiated may also be designed in consideration of antenna radiation performance.

According to an example embodiment of the disclosure, an electronic device (e.g., electronic device 200 of FIG. 2A) may include: a front plate (e.g., front plate 202 in FIG. 6), a rear plate (e.g., rear plate 211 in FIG. 6) positioned on an opposite side of the front plate, and a side member including a side surface (e.g., side member 218 in FIG. 6) surrounding at least a portion of the space between the front plate and the rear plate and including a non-conductive material. The electronic device may include a non-conductive member comprising a non-conductive material (e.g., first non-conductive member 410 in FIG. 4 or 6) positioned in the space along the side member. The electronic device may include a bonding member comprising an adhesive (e.g., bonding member 420 in FIG. 6) positioned between the side member and the non-conductive member. The electronic device may include at least one antenna (e.g., first conductive member 440 in FIG. 6, first antenna radiator 810 or second antenna radiator 820 in FIG. 8) positioned in the space and spaced apart from the side member with the non-conductive member interposed therebetween and coupled to the non-conductive member. The electronic device may include a communication circuit (e.g., wireless communication circuit 830 in FIG. 8) configured to transmit and/or receive a signal of a selected or designated frequency band through the at least one antenna.

According to an example embodiment of the disclosure, the side member (e.g., side member 218 in FIG. 4 or 6) may include a ceramic.

According to an example embodiment of the disclosure, one surface (e.g., one surface 218a in FIG. 6 or 7) of the side member (e.g., side member 218 in FIG. 6) bonded to the bonding member (e.g., bonding member 420 in FIG. 6) may include a concave-convex surface.

According to an example embodiment of the disclosure, the electronic device (e.g., electronic device 200 of FIG. 3) may further include: a support (e.g., first support member 311 in FIG. 3 or 6) positioned in the space and laterally surrounded by the non-conductive member (e.g., first non-conductive member 410 in FIG. 6). The at least one antenna (e.g., first conductive member 440 in FIG. 6, first antenna radiator 810 or second antenna radiator 820 in FIG. 8) may be disposed on the support.

According to an example embodiment of the disclosure, the at least one antenna (e.g., first conductive member 440 in FIG. 6, first antenna radiator 810 or second antenna radiator 820 in FIG. 8) may be disposed on the support (e.g., first support member 311 in FIG. 6) through laser direct structuring (LDS).

According to an example embodiment of the disclosure, the non-conductive member (e.g., first non-conductive member 410 in FIG. 6) may include a buffer material filled between the side member (e.g., side member 218 in FIG. 6) and the support (e.g., first support member 311 in FIG. 6).

According to an example embodiment of the disclosure, the electronic device (e.g., electronic device 200 of FIG. 2A) may further include a display (e.g., display 201 in FIG. 3 or 6) positioned between the support (e.g., first support member 311 in FIG. 3 or 6) and the front plate (e.g., front plate 202 in FIG. 3 or 6) and spaced apart from the at least one antenna (e.g., first conductive member 440 in FIG. 6, first antenna radiator 810 or second antenna radiator 820 in FIG. 8).

According to an example embodiment of the disclosure, the selected or designated frequency band may include 600 MHz to 6 GHz.

According to an example embodiment of the disclosure, the communication circuit (e.g., wireless communication circuit 830 in FIG. 8) may be configured to transmit and/or receive a signal passing through the side member (e.g., side member 218 in FIG. 6) to or from the outside through the at least one antenna (e.g., first conductive member 440 in FIG. 6, first antenna radiator 810 or second antenna radiator 820 in FIG. 8).

According to an example embodiment of the disclosure, the side member (e.g., side member 218 in FIG. 11) may include a first side part (e.g., first side part ① in FIG. 4) and a second side part (e.g., fourth side part ④ in FIG. 4) that are not parallel to each other, and a corner (e.g., fourth corner C4 in FIG. 4) connecting the first side part and the second side part. The non-conductive member (e.g., first non-conductive member 410 in FIG. 4) may include a first part (e.g., first part 411 in FIG. 12) disposed along the first side part, a second part (e.g., fourth part 414 in FIG. 12) disposed along the second side part, and a corner portion (e.g., fourth corner portion 504 in FIG. 12) disposed along the corner to connect the first part and the second part. When viewed from above the front plate (e.g., front plate 202 in FIG. 2A), the corner portion may be formed to be thicker than the first part and the second part.

According to an example embodiment of the disclosure, when viewed from above the front plate (e.g., front plate 202 in FIG. 2A), the corner (e.g., fourth corner C4 in FIG. 13) may be formed to be thicker than the first side part (e.g., first side part ① in FIG. 13) and the second side part (e.g., fourth side part ④ in FIG. 13), and may include a portion inserted into a recess (e.g., fourth recess R4 in FIG. 5, 11 or 12) formed in the first non-conductive member (e.g., first non-conductive member 410 in FIG. 5, 11 or 12).

According to an example embodiment of the disclosure, the first non-conductive member (e.g., first non-conductive member 410 in FIG. 5) may include an inclined surface (e.g., inclined surface 1201 or 1202 in FIG. 12) connecting the first part (e.g., first part 411 in FIG. 12) and the corner portion (e.g., fourth corner portion 504 in FIG. 12) or connecting the second part (e.g., fourth part 414 in FIG. 12) and the corner portion.

According to an example embodiment of the disclosure, the non-conductive member (e.g., first non-conductive member 410 in FIG. 14) may extend between a side surface (e.g., side surface 202C in FIG. 14) of the front plate (e.g., front plate 202 in FIG. 14) and the side member (e.g., side member 218 in FIG. 14), and/or between a side surface (e.g., side surface 211C in FIG. 14) of the rear plate (e.g., rear plate 211 in FIG. 14) and the side member.

According to an example embodiment of the disclosure, the front plate (e.g., front plate 202 in FIG. 14) and/or the rear plate (e.g., rear plate 211 in FIG. 14) may include glass.

According to an example embodiment of the disclosure, the electronic device (e.g., electronic device 200 of FIG. 2A) may further include: an antenna structure (e.g., antenna structure 1710 in FIG. 17). The antenna structure may include a printed circuit board (e.g., fourth printed circuit board 1750 in FIG. 17) having a first surface (e.g., first surface 1751 in FIG. 16) facing the side member (e.g., side member 218 in FIG. 16) and a second surface (e.g., second surface 1742 in FIG. 16) facing away from the first surface, and at least one antenna element including at least one antenna (e.g., antenna array 1760 in FIG. 17) positioned on the first surface or closer to the first surface than the second surface inside the printed circuit board. When viewed in a direction in which the main beam (e.g., main beam 1790 in FIG. 16) of the antenna structure is radiated, the at least one antenna element may overlap with the non-conductive member (e.g., first non-conductive member 410 in FIG. 16), the bonding member (e.g., bonding member 420 in FIG. 16), and the side member (e.g., side member 218 in FIG. 16). When viewed in a direction in which the main beam of the antenna structure is radiated, the at least one antenna element may not overlap with the at least one antenna (e.g., first conductive member 440 in FIG. 4, first antenna radiator 810 or second antenna radiator 820 in FIG. 8).

According to an example embodiment of the disclosure, the antenna structure (e.g., antenna structure 1710 in FIG. 17) may be configured to transmit and/or receive a signal in a frequency band of 6 GHz to 60 GHz.

According to various example embodiments of the disclosure, an electronic device (e.g., electronic device 200 of FIG. 2A) may include: a front plate (e.g., front plate 202 in FIG. 6), a rear plate (e.g., rear plate 211 in FIG. 6) positioned on an opposite side of the front plate, and a side member including a side surface (e.g., side member 218 in FIG. 6) at least partially surrounding a space between the front plate and the rear plate and including a ceramic. The electronic device may include a first non-conductive member comprising a non-conductive material (e.g., first non-conductive member 410 in FIG. 4 or 6) positioned in the space along the side member. The electronic device may include a support (e.g., first support member 311 in FIG. 4 or 6) positioned in the space and laterally surrounded by the first non-conductive member. The support may include a second non-conductive member comprising a non-conductive material (e.g., second non-conductive member 430 in FIG. 6), and at least one antenna (e.g., first conductive member 440 in FIG. 6, first antenna radiator 810 or second antenna radiator 820 in FIG. 8) positioned at least partially between the first non-conductive member and the second non-conductive member. The electronic device may include a bonding member comprising an adhesive (e.g., bonding member 420 in FIG. 6 or 7) positioned between the side member and the first non-conductive member. The electronic device may include a communication circuit (e.g., wireless communication circuit 830 in FIG. 8) configured to transmit and/or receive a signal of a selected or designated frequency band through the at least one antenna.

According to various example embodiments of the disclosure, the side member (e.g., side member 218 in FIG. 11) may include a first side part (e.g., first side part ① in FIG. 4) and a second side part (e.g., fourth side part ④ in FIG. 4) that are not parallel to each other, and a corner (e.g., fourth corner C4 in FIG. 4) connecting the first side part and the second side part. The non-conductive member (e.g., first non-conductive member 410 in FIG. 4) may include a first part (e.g., first part 411 in FIG. 12) disposed along the first side part, a second part (e.g., fourth part 414 in FIG. 12) disposed along the second side part, and a corner portion (e.g., fourth corner portion 504 in FIG. 12) disposed along the corner to connect the first part and the second part. When viewed from above the front plate (e.g., front plate 202 in FIG. 2A), the corner portion may be thicker than the first part and the second part.

According to various example embodiments of the disclosure, the first non-conductive member (e.g., first non-conductive member 410 in FIG. 5) may include an inclined surface (e.g., inclined surface 1201 or 1202 in FIG. 12) connecting the first part (e.g., first part 411 in FIG. 12) and the corner portion (e.g., fourth corner portion 504 in FIG. 12) or connecting the second part (e.g., fourth part 414 in FIG. 12) and the corner portion.

According to various example embodiments of the disclosure, the first non-conductive member (e.g., first non-conductive member 410 in FIG. 14) may extend between a side surface (e.g., side surface 202C in FIG. 14) of the front plate (e.g., front plate 202 in FIG. 14) and the side member (e.g., side member 218 in FIG. 14), and/or between a side surface (e.g., side surface 211C in FIG. 14) of the rear plate (e.g., rear plate 211 in FIG. 14) and the side member.

According to various example embodiments of the disclosure, the front plate (e.g., front plate 202 in FIG. 14) and/or the rear plate (e.g., rear plate 211 in FIG. 14) may include glass.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a front plate;
    a rear plate positioned on an opposite side of the front plate;
    a side member including a side surface surrounding at least a portion of a space between the front plate and the rear plate and including a non-conductive material;
    a non-conductive member comprising a non-conductive material positioned in the space along the side member;
    a bonding member comprising an adhesive positioned between the side member and the non-conductive member;
    at least one antenna positioned in the space and spaced apart from the side member with the non-conductive member interposed therebetween and coupled to the non-conductive member; and
    a communication circuit configured to transmit and/or receive a signal of a selected or designated frequency band through the at least one antenna.

2. The electronic device of claim 1, wherein the side member includes a ceramic.

3. The electronic device of claim 1, wherein one surface of the side member bonded to the bonding member includes a concave-convex surface.

4. The electronic device of claim 1, further comprising a support positioned in the space and laterally surrounded by the non-conductive member, wherein the at least one antenna is disposed on the support.

5. The electronic device of claim 4, wherein the at least one antenna is disposed on the support through laser direct structuring (LDS).

6. The electronic device of claim 4, wherein the non-conductive member includes a buffer material between the side member and the support member.

7. The electronic device of claim 4, further comprising a display positioned between the support and the front plate and spaced apart from the at least one antenna.

8. The electronic device of claim 1, wherein the selected or designated frequency band includes a range of 600 MHz to 6 GHz.

9. The electronic device of claim 1, wherein the communication circuit is configured to transmit and/or receive a signal passing through the side member to or from an outside through the at least one antenna.

10. The electronic device of claim 1, wherein:
    the side member includes a first side part and a second side part that are not parallel to each other, and a corner connecting the first side part and the second side part;
    the non-conductive member includes a first part disposed along the first side part, a second part disposed along the second side part, and a corner portion disposed along the corner to connect the first part and the second part; and
    wherein the corner portion is thicker than the first part and the second part when viewed from above the front plate.

11. The electronic device of claim 10, wherein, when viewed from above the front plate, the corner is thicker than the first side part and the second side part and includes a portion inserted into a recess in the first non-conductive member.

12. The electronic device of claim 10, wherein the first non-conductive member includes an inclined surface connecting the first part and the corner portion or connecting the second part and the corner portion.

13. The electronic device of claim 1, wherein the non-conductive member extends between a side surface of the front plate and the side member and/or between a side surface of the rear plate and the side member.

14. The electronic device of claim 13, wherein the front plate and/or the rear plate include glass.

15. The electronic device of claim 1, further comprising an antenna structure including a printed circuit board having a first surface facing the side member and a second surface facing away from the first surface, and at least one antenna element including an antenna positioned on the first surface or closer to the first surface than the second surface inside the printed circuit board, and wherein, when viewed in a direction in which a main beam of the antenna structure is radiated, the at least one antenna element overlaps with the non-conductive member, the bonding member and the side member, and does not overlap with the at least one antenna.

16. The electronic device of claim 15, wherein the antenna structure is configured to transmit and/or receive a signal in a frequency band of 6 GHz to 60 GHz.

17. An electronic device comprising:
a front plate;
a rear plate positioned on an opposite side of the front plate;
a side member including a side surface at least partially surrounding a space between the front plate and the rear plate and including a ceramic;
a first non-conductive member comprising a non-conductive material positioned in the space along the side member;
a support positioned in the space and laterally surrounded by the first non-conductive member, the support comprising:
a second non-conductive member comprising a non-conductive material, and
at least one antenna positioned at least partially between the first non-conductive member and the second non-conductive member;
a bonding member comprising an adhesive positioned between the side member and the first non-conductive member; and
a communication circuit configured to transmit and/or receive a signal of a selected or designated frequency band through the at least one antenna.

18. The electronic device of claim 17, wherein the side member include a first side part and a second side part that are not parallel to each other, and a corner connecting the first side part and the second side part,
wherein the non-conductive member include a first part disposed along the first side part, a second part disposed along the second side part, and a corner portion disposed along the corner to connect the first part and the second part, and
wherein, when viewed from above the front plate, the corner portion is thicker than the first part and the second part.

19. The electronic device of claim 18, wherein the first non-conductive member include an inclined surface connecting the first part and the corner portion or connecting the second part and the corner portion.

20. The electronic device of claim 18, wherein the first non-conductive member extends between a side surface of the front plate and the side member, and/or between a side surface of the rear plate and the side member.

* * * * *